(12) United States Patent
Ipposhi et al.

(10) Patent No.: US 6,596,615 B2
(45) Date of Patent: *Jul. 22, 2003

(54) SEMICONDUCTOR DEVICE AND METHOD OF MANUFACTURING THE SAME

(75) Inventors: Takashi Ipposhi, Hyogo (JP); Toshiaki Iwamatsu, Hyogo (JP); Yasuo Yamaguchi, Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/481,385

(22) Filed: Jan. 12, 2000

(65) Prior Publication Data
US 2002/0016025 A1 Feb. 7, 2002

Related U.S. Application Data

(62) Division of application No. 08/746,527, filed on Nov. 12, 1996, now Pat. No. 6,025,629.

(30) Foreign Application Priority Data

Apr. 24, 1996 (JP) .............................................. 8-102582

(51) Int. Cl.[7] .......................................... H01L 21/8238
(52) U.S. Cl. ......................... 438/586; 438/303; 438/655
(58) Field of Search ................................. 438/149, 452, 438/424, 431, 439, 303, 586, 655, 683, 443, 438, 444, 448, 734, 736, 744; 257/347, 354, 623

(56) References Cited

U.S. PATENT DOCUMENTS

| | | | | |
|---|---|---|---|---|
| 4,466,176 A | * | 8/1984 | Temple | 29/571 |
| 4,538,343 A | * | 9/1985 | Pollack et al. | 29/576 |
| 4,753,896 A | | 6/1988 | Matloubian | |

(List continued on next page.)

FOREIGN PATENT DOCUMENTS

| JP | 405291242 | * 11/1993 | 438/229 |
|---|---|---|---|

*Primary Examiner*—Carl Whitehead, Jr.
*Assistant Examiner*—Laura Schillinger
(74) *Attorney, Agent, or Firm*—McDermott, Will & Emery

(57) ABSTRACT

A sidewall oxide layer and a sidewall insulation layer are formed to cover the edge portion of an SOI layer. A channel stopper region is formed in the vicinity of the edge portion of the SOI layer. A protruded insulation layer is formed on the channel stopper region. A gate electrode extends from a region over the SOI layer to the protruded insulation layer and the sidewall insulation layer. In this way, reduction in threshold voltage Vth of a parasitic MOS transistor at the edge portion of the SOI layer can be suppressed.

7 Claims, 26 Drawing Sheets

U.S. PATENT DOCUMENTS

| | | | |
|---|---|---|---|
| 4,786,615 A | * 11/1988 | Liaw et al. | 117/89 |
| 4,864,380 A | 9/1989 | Plus et al. | |
| 4,906,587 A | * 3/1990 | Blake | 438/151 |
| 4,946,799 A | * 8/1990 | Blake et al. | 438/154 |
| 4,965,213 A | * 10/1990 | Blake | 438/154 |
| 5,095,348 A | 3/1992 | Houston | |
| 5,218,214 A | 6/1993 | Tyson et al. | |
| 5,342,480 A | * 8/1994 | Nishizawa et al. | 156/648 |
| 5,498,891 A | 3/1996 | Sato | |
| 5,498,893 A | 3/1996 | Usui et al. | |
| 5,652,453 A | 7/1997 | Iwamatsu et al. | |
| 5,831,323 A | 11/1998 | Motonami et al. | |
| 5,846,596 A | * 12/1998 | Shim et al. | 427/96 |
| 5,894,059 A | * 4/1999 | Peidous et al. | 430/316 |
| 5,909,629 A | * 6/1999 | Manning | 438/439 |
| 5,922,622 A | * 7/1999 | Lee et al. | 438/734 |
| 5,923,981 A | * 7/1999 | Qian | 438/284 |
| 5,930,647 A | * 7/1999 | Mathews | 438/443 |
| 5,940,701 A | * 8/1999 | Tseng | 438/253 |
| 5,970,329 A | * 10/1999 | Cha | 438/197 |
| 5,989,980 A | * 11/1999 | Lee et al. | 438/452 |
| 6,005,285 A | * 12/1999 | Gardner et al. | 257/607 |
| 6,025,629 A | * 2/2000 | Ipposhi et al. | 257/347 |
| 6,071,793 A | * 6/2000 | Peidous et al. | 438/424 |
| 6,165,826 A | * 12/2000 | Chau et al. | 438/231 |
| 6,200,871 B1 | * 3/2001 | Moslehi | 438/303 |
| 6,204,153 B1 | * 3/2001 | Gardner et al. | 438/478 |
| 6,245,644 B1 | * 6/2001 | Mathews | 438/443 |

* cited by examiner

SEMICONDUCTOR DEVICE AND METHOD OF MANUFACTURING THE SAME

This application is a Divisional of application Ser. No. 08/746,527 filed Nov. 12, 1996 now U.S. Pat. No. 6,025,629.

BACKGROUND OF THE INVENTION

1. Field of the Invention

The present invention relates to a semiconductor device and a method of manufacturing the same, and particularly to an element isolation structure of a semiconductor device and a method of manufacturing the same.

2. Description of the Background Art

Conventionally, LOCOS (Local Oxidation of Silicon) is widely known as a method for providing isolation between elements. FIGS. 47 and 48 are cross sectional views showing the process flow in the case in which this LOCOS method is employed in a semiconductor device having an SOI (Semiconductor On Insulator) structure.

Referring first to FIG. 47, a semiconductor layer (hereinafter simply referred to as "SOI layer") 3 is formed on a main surface of a silicon substrate 1 with a buried oxide layer 2 therebetween, using SIMOX (Separation by Implanted Oxygen) method or the like. On this SOI layer 3, a nitride layer 11 patterned to obtain a prescribed shape is formed. Using this nitride layer 11 as a mask, ions of boron (B) are implanted to SOI layer 3. As a result, an impurity implantation region 4a which is to be a channel stopper region is formed.

Thereafter, LOCOS processing is performed on SOI layer 3 in a state as shown in FIG. 47. This forms an isolation oxide layer 20 selectively at SOI layer 3 as shown in FIG. 48. At this time, owing to the formation of isolation oxide layer 20, most of the impurity (boron) for forming the channel stopper region mentioned above is absorbed. Accordingly, ion implantation of boron (B) has to take place again in the vicinity of the edge portion of SOI layer 3 after isolating oxide film 20 is formed, thereby forming a channel stopper region 4 including an impurity (boron) of high concentration in the vicinity of the edge portion of SOI layer 3. As a result, it is made possible to effectively suppress the decrease of threshold voltage Vth of a parasitic MOS transistor in the vicinity of the edge portion of SOI layer 3.

However, when ion implantation of boron for forming channel stopper region 4 is performed after isolation oxide layer 20 is formed, there has been a problem as described in the following.

As shown in FIG. 48, one way to form channel stopper region 4 after the formation of isolation oxide layer 20 is to implant ions of boron selectively into the vicinity of the edge portion of SOI layer 3 only, with nitride layer 11 still remaining. Since this method enables channel stopper region 4 to be formed in a self-aligned manner, there is no need to form a new mask layer for ion implantation of boron described above. However, as shown in FIG. 48, implantation of boron ions by oblique ion implantation method is required in the vicinity of edge portion of SOI layer 3. Therefore, the above-described boron would be implanted to the region where the channel of MOS transistor is formed. As a result, there has been a problem that the effective channel width W would be small.

One method by which the problem as described above can be solved is a mesa isolation method shown in FIGS. 49 to 51. FIG. 49 is a cross-sectional view showing a semiconductor device in which a conventional mesa isolation method is adopted. FIGS. 50 and 51 are cross-sectional views showing the manufacturing process which is characteristic in the semiconductor device of FIG. 49.

Referring first to FIG. 49, a channel stopper region 4 is formed in the vicinity of the edge portion of an SOI layer 3. A recess portion 24 is formed directly under the edge portion of SOI layer 3. A gate insulation layer 7 is formed to cover SOI layer 3, and a gate electrode 8 is formed to cover this gate insulation layer 7.

Referring next to FIGS. 50 and 51, a method of manufacturing the semiconductor device shown in FIG. 49 will now be described. Referring first to FIG. 50, ion implantation of boron (B) for forming channel stopper region 4 is performed to SOI layer 3 by a method similar to the example of the above-described LOCOS. Thereafter, a nitride layer (not shown) is additionally formed to cover nitride layer 11, using CVD (Chemical Vapor Deposition). Then, by performing an anisotropical etching to the nitride layer, a nitride spacer 12 is formed as shown in FIG. 51. Thereafter, using nitride layer 11 and nitride spacer 12 as a mask, SOI layer 3 is patterned, followed by thermal oxidation for eliminating etching damages. Thus, a sidewall oxide layer 5 is formed at the sidewall of SOI layer 3, as shown in FIG. 51.

Thereafter, nitride layer 11, nitride spacer 12 and oxide layer 9 are removed by etching. As a result, recess portion 24 is formed directly beneath the edge portion of SOI layer 3.

Thereafter, gate insulation layer 7 is formed on the surface of SOI layer 3, and a gate electrode 8 is formed so as to cover this gate insulation layer 7. Then, in this case, source/drain regions are formed so as to sandwich the gate electrode 8 in SOI layer 3.

By the process as described above, a semiconductor device shown in FIG. 49 is formed. In this semiconductor device shown in FIG. 49, boron (B) for forming channel stopper region 4 is not implanted for the second time as in the case where the LOCOS method is adopted. Accordingly, the problem of small effective channel width W in the case where LOCOS is adopted can be solved.

However, even in the semiconductor device shown in FIG. 49, there has been a problem as described in the following. As shown in FIG. 51, sidewall oxide layer 5 is formed after the formation of channel stopper region 4. At this time, the impurity (boron) could be drawn out from channel stopper region 4 due to the formation of this sidewall oxide layer 5, although not as much as in the case of the above-described LOCOS method. Accordingly, concentration of the impurity (boron) within channel stopper region 4 is reduced, thus leading to a problem that threshold voltage Vth of the parasitic MOS transistor at the edge portion of SOI layer 3 is lowered. In addition, as shown in FIG. 49, recess portion 24 is formed directly beneath the edge portion of SOI layer 3. With such recess portion 24 formed, concentration of electric field is likely at the sidewall bottom portion 26 of SOI layer 3. This also leads to increase in the possibility of insulation breakdown, thus lowering the yield of the transistor.

SUMMARY OF THE INVENTION

The present invention was made to solve the problems as described above. It is one object of the present invention to provide a semiconductor device in which effective suppression of decrease in the threshold voltage Vth of a parasitic MOS transistor at an edge portion of an SOI layer is possible, and a method of manufacturing the same.

It is another object of the present invention to provide a semiconductor device in which effective suppression of insulation breakdown of a gate insulation layer is possible.

It is assumed that the semiconductor device according to the present invention has an SOI (Semiconductor on Insulator) structure. The semiconductor device according to the present invention includes a semiconductor substrate having a main surface, a mesa type semiconductor layer isolated by mesa isolation method, a channel stopper region, an isolating insulation layer, and a gate electrode. A semiconductor layer is formed on the main surface of the semiconductor substrate with a buried insulation layer therebetween, and has source/drain regions internally. The channel stopper region is formed in the vicinity of the edge portion of the semiconductor layer. The isolation insulation layer is formed on the channel stopper region and on the edge portion of the semiconductor layer, and has an upper surface on the channel stopper region inclined so as to be apart upwards from the upper surface of the semiconductor layer as it approaches the edge portion of the semiconductor layer. The gate electrode is extended from a region over the semiconductor layer to the isolating insulation layer.

As described above, in the semiconductor device according to the present invention, the isolating insulation layer is formed on the channel stopper region and on the edge portion of the semiconductor layer. By this isolating insulation layer, it is made possible to effectively prevent the formation of recess portion 24 shown in FIG. 49 directly under the edge portion of the semiconductor layer. In addition, the isolating insulation layer is also formed on the channel stopper region and has an upper surface inclined to be apart upwards from the upper surface of the semiconductor layer as it approaches the edge portion of the semiconductor layer. Since the gate electrode extends on the isolating insulation layer, it is possible to keep away the gate electrode from the edge portion of the semiconductor layer. Accordingly, it is possible to suppress decrease in the threshold voltage Vth of the parasitic MOS transistor at the edge portion of the semiconductor layer.

Preferably, the side end portion of the isolating insulation layer located on the semiconductor layer is placed closer to the edge portion of the semiconductor layer than to the inner side end portion of the channel stopper region located in the semiconductor layer. Thus, it is ensured that the inclined upper surface of the isolating insulation layer can be arranged on the region in the vicinity of the edge portion of the semiconductor layer. As a result, it is made possible to keep away the gate electrode from the edge portion of the semiconductor layer with more certainty.

Also, the above-described isolating insulation layer may include a protruded insulation layer formed on the channel stopper region and a sidewall insulation layer formed under this protruded insulation layer covering the edge portion of the semiconductor layer.

In addition, it is preferred that the above-described isolating insulation layer extends from a region over the channel stopper region to the buried insulation layer approximate the semiconductor layer, having an even upper surface adjacent to the above-described inclined upper surface. Also, the semiconductor layer preferably has a first conductive layer formed thereon with a gate insulation layer therebetween, and a second conductive layer is formed on this first conductive layer to extend over the isolating insulation layer. These first and second conductive layers form a gate electrode. It is preferred that the above-described even upper surface is positioned higher with respect to the upper surface of the semiconductor layer as compared to the upper surface of the above-described first conductive layer. In this way, the second conductive layer can be kept from the edge portion of the semiconductor layer effectively. As a result, it is made possible to effectively suppress the decrease in the threshold voltage Vth of the parasitic MOS transistor at the edge portion of the semiconductor layer.

In the method of manufacturing a semiconductor device according to the present invention, in one aspect, an SOI substrate is prepared by forming a semiconductor layer on a main surface of a semiconductor substrate with a buried insulation layer therebetween. An insulation layer is formed on this semiconductor layer, and a first masking layer is formed selectively on this insulation layer. A second masking layer of a material different from that of the first masking layer is formed selectively on the insulation layer to cover the sidewall and the upper surface of the first masking layer. Using this second masking layer as a mask, the insulation layer and the semiconductor layer are patterned. Then, using the second masking layer as a mask, the sidewall of the patterned semiconductor layer is oxidized. After removing the second masking layer, the first masking layer is used as a mask for implanting impurity to the region in the vicinity of the edge portion of the semiconductor layer which had been covered with the second masking layer, thereby forming a channel stopper region. A gate electrode is formed above the semiconductor layer. Source/drain regions are formed within the semiconductor layer.

As described above, in one aspect of the method of manufacturing the semiconductor device according to the present invention, the semiconductor layer is patterned by using the second masking layer formed to cover the sidewall and the upper surface of the first masking layer as a mask, and then this second masking layer is used as a mask to oxidize the sidewall of the semiconductor layer. After removing this second masking layer, the first masking layer is used as a mask to implant impurity for forming the channel stopper region into the region in the vicinity of the edge portion of the semiconductor layer which had been covered with the second masking layer in a self-aligned manner. Thus, absorption of the impurity for forming the channel stopper region into the oxide film formed by thermal treatment performed to the above-described sidewall of the semiconductor layer can be suppressed effectively. As a result, reduction in concentration of impurity contained in the channel stopper region can be suppressed effectively. Thus, reduction in threshold voltage Vth of the parasitic MOS transistor at the edge portion of the semiconductor layer can be suppressed effectively.

In addition, the step of forming the above-described channel stopper region preferably includes the step of performing a channel doping by implanting impurity into the semiconductor layer by the energy penetrating the first masking layer to reach the semiconductor layer. Thus, it is made also possible to perform a channel doping using the mask for forming the channel stopper region. As a result, it becomes unnecessary to form a new masking layer for channel doping such that the process can be simplified.

Also, it is preferred that the above-described first masking layer is formed of polycrystalline silicon and the second masking layer of nitride. In addition, the step of forming the gate electrode includes steps of forming a sidewall insulation layer on the sidewall of the first masking layer and the sidewall of the semiconductor layer, selectively exposing the surface of the semiconductor layer by etching away the first masking layer and the insulation layer successively, and forming the gate electrode on the surface of the exposed semiconductor layer with a gate insulation layer therebetween. By forming a sidewall insulation layer at the sidewall of the first masking layer and on the sidewall of the semiconductor layer as described above, it is made possible to keep away the gate electrode from the edge portion of the semiconductor layer upon formation of the gate electrode above the semiconductor layer, and in addition, it is also made possible to protect the edge portion of the semiconductor layer.

In addition, the above-described step of forming the gate electrode preferably includes steps of forming an isolating insulation layer on the buried insulation layer to cover the first masking layer and the channel stopper region, and removing a portion of the isolating insulation layer to expose the upper surface of the first masking layer. At this time, the first masking layer is provided so that it can function as a stopper. In this way, when a portion of the isolating insulation layer is removed by a CMP (Chemical Mechanical Polishing) process, for example, the accuracy of the polishing by the CMP process can be improved. In addition, by forming the isolating insulation layer in this way, it is also possible to protect the edge portion of the semiconductor layer by this isolating insulation layer.

The above-described step of forming the gate electrode preferably further includes the steps of exposing selectively the surface of the semiconductor layer by removing the above-described exposed first masking layer and the insulation layer, and forming a gate electrode on the exposed surface of the semiconductor layer with the gate insulation layer therebetween. By removing the first masking layer and the insulation layer in this way, it is possible to form an isolating insulation layer having a sloped surface inclining upwards as it extend toward the edge portion of the semiconductor layer on the channel stopper region. Thus, it is possible to effectively keep away the gate electrode from the edge portion of the semiconductor layer.

In addition, the above-described first masking layer is preferably formed of polycrystalline silicon, and the step of forming the gate electrode preferably further includes the steps of forming a polycrystalline silicon layer on the first masking layer to extend over the isolating insulation layer and forming a gate electrode by patterning this polycrystalline layer and the first masking layer. By thus forming the first masking layer from polycrystalline silicon, this first masking layer can be used as a portion of the gate electrode. In this case, the only step needed is to form a new polycrystalline silicon layer on the first masking layer, and thus the manufacturing process can be simplified as compared to the case in which the first masking layer has to be removed.

In addition, the above-described first masking layer may include first and second polycrystalline silicon layers, and the above-described insulation layer may include first and second insulation layers. In this case, the step of forming the first masking layer includes the steps of forming the first polycrystalline silicon layer on the semiconductor layer with a first insulation layer therebetween, and forming the second polycrystalline silicon layer on this first polycrystalline silicon layer with a second insulation layer therebetween. The second masking layer is formed to cover the first and second polycrystalline silicon layers. The step of forming the gate electrode preferably includes the steps of exposing the surface of the above-described second polycrystalline silicon layer by a process of removing a portion of the isolating insulation layer, removing this second polycrystalline silicon layer and the second insulation layer, forming a third polycrystalline silicon layer on the first polycrystalline silicon layer to be extended on the isolating insulation layer, and forming a gate electrode by patterning the third polycrystalline silicon layer and the first polycrystalline silicon layer. By thus forming the first and second polycrystalline silicon layers, the level of the upper surface of the isolating insulation layer after the process of removing a portion of the isolating insulation layer can be made higher than the level of the upper surface of the first polycrystalline silicon layer. Accordingly, the gate electrode can be kept away from the edge portion of the semiconductor layer more effectively.

The above-described step of forming the first masking layer preferably includes the step of forming a nitride layer on the above-described second polycrystalline silicon layer, and forming first and second sidewall oxide layers by using this nitride layer as a mask for oxidizing the sidewall of first and second polycrystalline silicon layers. The step of forming the second masking layer includes the step of forming the second masking layer to cover the first and second sidewall oxide layers. By thus oxidizing the edge portion of the first and second polycrystalline silicon layers, it is possible to eliminate the etching damage upon the patterning of the first and second polycrystalline silicon layers.

In accordance with the method of manufacturing the semiconductor device according to the present invention, in another aspect, an insulation layer is first formed on a main surface of a semiconductor substrate, and a first masking layer is formed selectively on this insulation layer. Covering the upper surface and the sidewall of this first masking layer, a second masking layer of a material different from that of the first masking layer is formed selectively on the insulation layer. Using this second masking layer as mask, the insulation layer and the main surface of the semiconductor substrate are subjected to etching so as to form a trench for element isolation. Using the second masking layer as a mask, inner surface of the trench is oxidized. After removing the second masking layer, the first masking layer is used as a mask to implant impurity to the inner surface of the trench and the main surface of the semiconductor substrate which was covered by the second masking layer so as to form a channel stopper region. An isolating insulation layer is formed on the main surface of the semiconductor substrate to cover the first masking layer and the trench. A portion of the isolating insulation layer is removed to expose the upper surface of the first masking layer. Then, a gate electrode is formed above the main surface of the semiconductor substrate. Source/drain regions are formed in the main surface of the semiconductor substrate to sandwich the above-described gate electrode.

As described above, after the trench is formed using the second masking layer as a mask, the second masking layer is removed, and the first masking layer is used as a mask to implant impurity to the inner surface of the trench and to the main surface of the semiconductor substrate which was covered by the second masking layer so as to form the channel stopper region. In this way, it is possible to form the channel stopper region also in the main surface of the semiconductor substrate between the side end portion of the first masking layer and the upper end corner portion of the trench. Since implantation of impurity for forming the channel stopper region is performed after the oxidation of the inner surface of the trench in this aspect also, decrease in the impurity concentration at the channel stopper region can be suppressed as in the case of the one aspect described above. Accordingly, it is possible to prevent effectively the decrease in the threshold voltage Vth of the parasitic MOS transistor.

In accordance with a method of manufacturing a semiconductor device according to the present invention, in still another aspect, an SOI (Semiconductor On Insulator) substrate is first prepared by forming a semiconductor layer on a main surface of a semiconductor substrate with a buried insulation layer therebetween. An insulation layer is formed on this semiconductor layer, and a first masking layer is formed selectively on this insulation layer. A second masking layer of a material different from that of the first masking layer is formed selectively on the insulation layer so as to cover the upper surface and the sidewall of this first masking layer. Using this second masking layer as a mask, the semiconductor layer is subjected to a selective oxidation to form an isolating oxide film. After removing the second masking layer, the first masking layer is used as a mask for implanting impurity in the vicinity of the edge portion of the semiconductor layer which was covered by the second masking layer, thereby forming a channel stopper region. A gate electrode is formed above the semiconductor layer. Source/drain regions are formed in the semiconductor layer, sandwiching this gate electrode.

As described above, in this aspect, the second masking layer is used as a mask for forming the isolating oxide film, the second masking layer is then removed, and thereafter, the first masking layer is used as a mask to implant impurity in the vicinity of the edge portion of the semiconductor layer which was covered by the second masking layer so as to form the channel stopper region. In this way, the channel stopper region can be formed in the vicinity of the edge portion of the semiconductor layer in the self-aligned manner with certainty, and in addition, it is made possible to prevent effectively the absorption of the impurity from the channel stopper region owing to the formation of isolating oxide film. Thus, it is ensured that channel stopper region including impurity of high concentration can be formed at the edge portion of the semiconductor layer. As a result, decrease in the threshold voltage Vth of parasitic MOS transistor at the edge portion of the semiconductor layer can be suppressed effectively.

The above-described step of forming the isolating oxide film may include the steps of forming an oxide layer having a bottom surface in the semiconductor layer by selectively oxidizing the semiconductor layer using the second masking layer as mask, forming a nitride layer after removing this oxide layer to cover the semiconductor layer and a second masking layer, performing anisotropical etching to this nitride layer such that the nitride layer is left under the second masking layer, and forming the isolating oxide film by selectively oxidizing the semiconductor layer using the second masking layer and the nitride layer as a mask. By forming the isolating oxide film through a process as described above, the slope of the side surface of the semiconductor layer can be made steep. Accordingly, partial reduction in the film thickness at the edge portion of the semiconductor layer can be suppressed effectively. Thus, formation of a parasitic MOS transistor with a low threshold voltage Vth at the edge portion of the semiconductor layer can be suppressed effectively.

The above-described first masking layer is preferably formed of polycrystalline silicon. The step of forming the gate electrode preferably includes the steps of forming a polycrystalline silicon layer on the first masking layer and on the isolating oxide film, and forming the gate electrode by patterning this polycrystalline silicon layer and the first masking layer. As a result, manufacturing process can be simplified as compared to the case in which the first masking layer is removed.

In accordance with a method of manufacturing a semiconductor device according to the present invention, in still another aspect, an SOI (Semiconductor On Insulator) substrate is prepared by forming a semiconductor layer on a main surface of a semiconductor substrate with a buried insulation layer therebetween. A first masking layer is formed on this semiconductor layer with an insulation layer therebetween. On this first masking layer, a second masking layer of a material different from that of the first masking layer is formed. After patterning the second masking layer, this second masking layer is used as a mask to implant impurity for forming a channel stopper region in the semiconductor layer. A third masking layer of a material which is the same as that of the second masking layer is formed on the sidewall of the second masking layer. Thereafter, using these second and third masking layers as a mask, the first masking layer, the insulation layer and the semiconductor layer are patterned successively. After removing the second and third masking layers, a sidewall insulation layer is formed on the sidewall of the semiconductor layer. By etching away the first masking layer and the insulation layer, the surface of the semiconductor layer is exposed. A gate electrode is formed on the surface of the semiconductor layer with a gate insulation layer therebetween. Source/drain regions are formed in the semiconductor layer, sandwiching the gate electrode.

As described above, in this aspect, after implanting the impurity into the semiconductor layer for forming the channel stopper region using the second masking layer as a mask, the third masking layer formed on the sidewall of the second masking layer as well as the second masking layer are used to pattern the semiconductor layer. Accordingly, it is possible to form a channel stopper region in the vicinity of the edge portion of the semiconductor layer in a self-aligned manner. After removing the second and third masking layers, a sidewall insulation layer is formed on the sidewall of the semiconductor layer. After the formation of this sidewall insulation layer, the first masking layer and insulation layer are etched away. At this time, formation of the sidewall insulation layer effectively prevents formation of a recess portion immediately under the edge portion of the semiconductor layer upon etching of the first masking layer and the insulation layer. Thus, it is possible to suppress the insulation breakdown of the gate insulation layer at the bottom portion of sidewall of the semiconductor layer effectively.

The above-described insulation layer is preferably a CVD (Chemical Vapor Deposition) oxide layer, the buried insulation layer is preferably an oxide layer formed by thermal oxidation, and the sidewall insulation layer is preferably a CVD (Chemical Vapor Deposition) oxide layer using TEOS (Tetra Ethyl Ortho Silicate). As described above, by providing a CVD oxide layer as the insulating layer, it is possible to reduce the time for wet etching as compared to the case in which an oxide layer formed by thermal oxidation is used. Accordingly, the amount of etching of the buried insulation layer caused by the etching of the insulation layer can be reduced. In addition, by providing CVD oxide layer using TEOS as the sidewall insulation layer, the etching rate of the sidewall insulation layer can be larger than the etching rate of the buried insulation layer. Accordingly, it is possible to prevent effectively the recess portion from being formed to extend under the sidewall insulation layer. As a result, patterning of the gate electrode would be easier as compared to the case in which the recess portion is formed to extend under the sidewall insulation layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will now be described in the following with reference to FIGS. 1 to 46.
[Embodiment 1]

Figure 1:
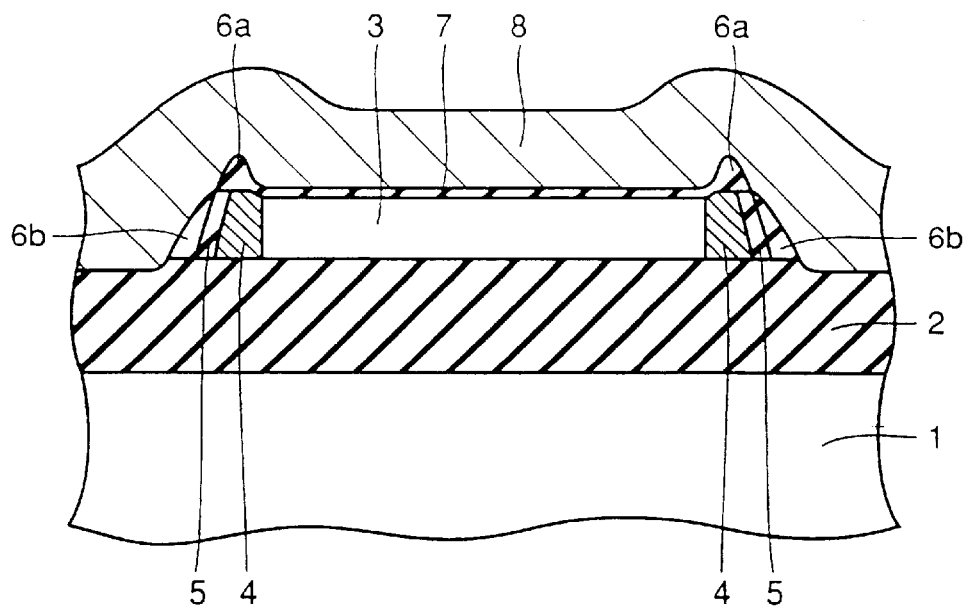
FIG. 1 is a cross-sectional view showing a semiconductor device according to Embodiment 1 of the present invention.
Figure 2:
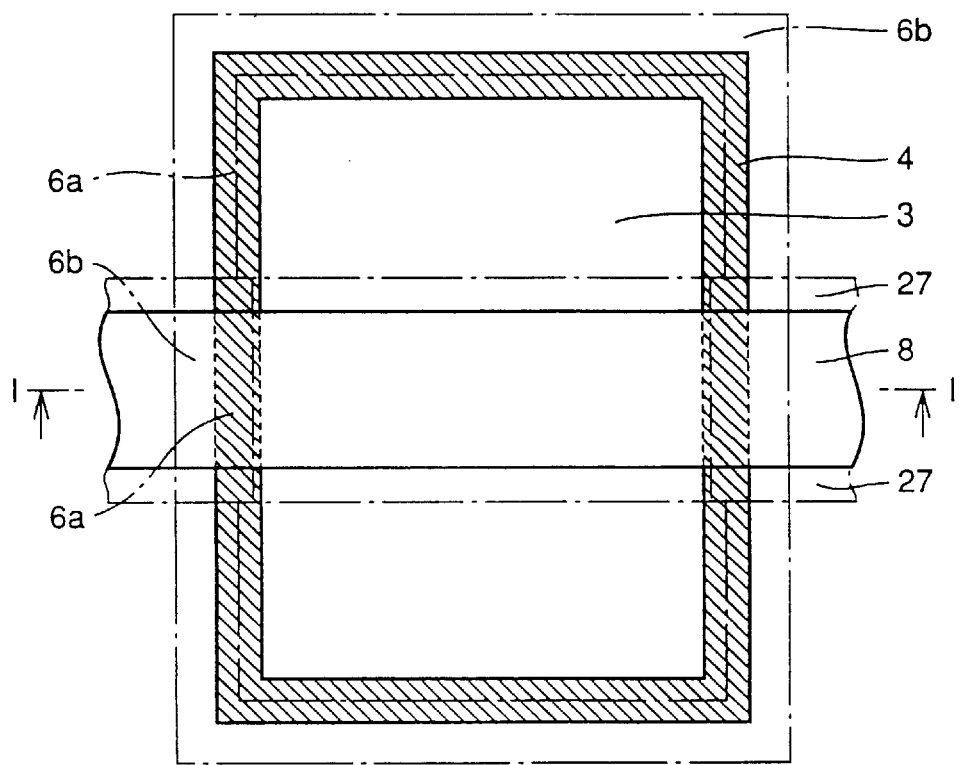
FIG. 2 is a plan view of the semiconductor device shown in FIG. 1.

Referring first to FIGS. 1 to 7, description is made for Embodiment 1 of the present invention. FIG. 1 is a cross-sectional view showing a semiconductor device according to Embodiment 1 of the present invention. FIG. 2 is a plan view of a semiconductor device shown in FIG. 1, in which the cross section taken along line I—I corresponds to the cross-sectional view of FIG. 1.

Referring to FIG. 1, an SOI layer 3 is formed on a main surface of a silicon substrate 1 with a buried oxide layer 2 therebetween. In the vicinity of the edge portion of SOI layer 3, a channel stopper region 4 is formed. A sidewall oxide layer 5 is formed on the sidewall of SOI layer 3, covering this channel stopper region 4. In addition, a protruded insulation layer 6a of silicon nitride, silicon oxide or the like is formed on channel stopper region 4. A sidewall insulation layer 6b of an insulator such as silicon nitride or silicon oxide is formed to cover the sidewall of sidewall oxide layer 5. A gate insulation layer 7 is formed on the surface of SOI layer 3. A gate electrode 8 is formed to cover this gate insulation layer 7, protruded insulation layer 6a, and sidewall insulation layer 6b.

Referring next to FIG. 2, a sidewall insulation layer 6b is formed to surround channel stopper region 4. In addition, frame-shaped protruded insulation layer 6a is formed on channel stopper region 4. When, for example, a sidewall insulation layer 27 is formed on the sidewall of gate electrode 8, the plane width of this protruded insulation layer 6a would be different between the portion located under sidewall insulation layer 27 or gate electrode 8 and the other portions if seen two dimensionally. However, at either portions, the side end portion of protruded insulation layer 6a on SOI layer 3 is preferably located immediately on the inner side end portion of channel stopper region 4 or located closer to the edge portion of SOI layer 3 than this inner side end portion. Thus, it is possible to keep away the gate electrode 8 upwards from the edge portion of SOI layer 3 effectively. Accordingly, reduction in threshold voltage Vth of parasitic MOS transistor in the vicinity of the edge portion of SOI layer 3 can be suppressed effectively.

In addition, as described above, formation of sidewall oxide layer 5 and sidewall insulation layer 6b covering the sidewall of SOI layer 3 enables protection of the edge portion of SOI layer 3. In particular, by covering the bottom portion of sidewall of SOI layer 3 with the above-described sidewall oxide layer 5 and sidewall insulation layer 6b, recess portion 24 is effectively prevented from being formed immediately under the edge portion of SOI layer 3 as in the conventional example. Thus, it is also possible to suppress effectively the insulation breakdown of the gate insulating layer in the vicinity of the edge portion of SOI layer 3.

Referring next to FIGS. 3 to 7, description will be made for the method of manufacturing the semiconductor device shown in FIGS. 1 and 2. FIGS. 3 to 7 are cross-sectional views showing first to fifth steps in the manufacturing process of the semiconductor device shown in FIG. 1. Although formation of nMOS transistor is referred to in the description of each of the embodiments described in the following, the concept of the present invention is also applicable to pMOS transistors.

Figure 3:
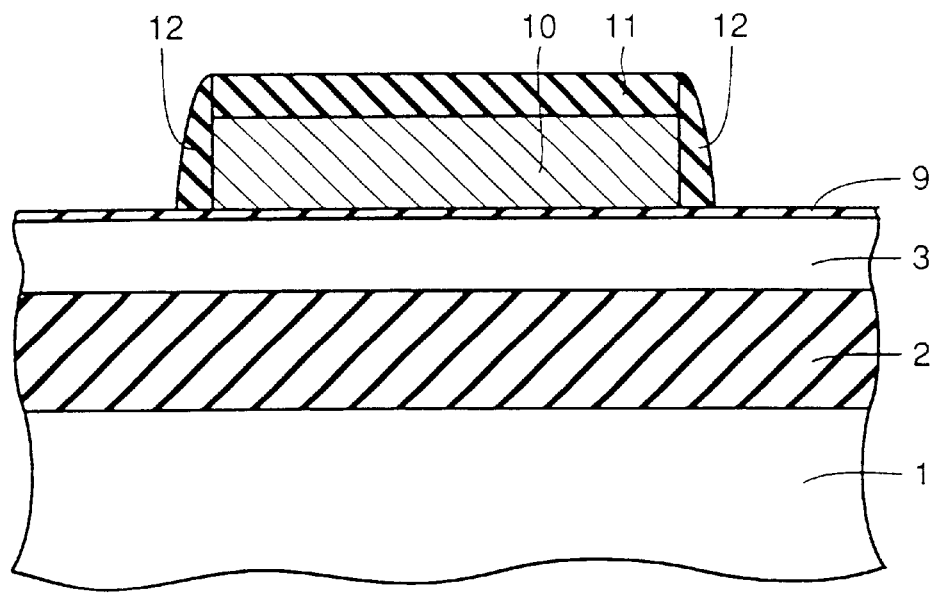
FIGS. 3 to 7 are cross-sectional views showing the first to fifth steps in the manufacturing process of the semiconductor device according to Embodiment 1.

Referring first to FIG. 3, SOI layer 3 is formed on the main surface of silicon substrate 1 with buried oxide film 2 therebetween by the same method as in the conventional example. On this SOI layer 3, oxide layer 9 having a thickness of about 10 to about 30 nm is formed. Polycrystalline silicon layer 10 with a thickness of about 100 to about 250 nm and nitride layer 11 with a thickness of about 100 to about 250 nm are successively deposited on this oxide layer 9. Then, a photoresist pattern (not shown) having a prescribed shape is formed on nitride layer 11. Using this photoresist pattern as a mask, nitride layer 11 and polycrystalline silicon layer 9 are subjected to patterning successively. Thereafter, the photoresist pattern is removed. This photoresist pattern may be removed after being used as a mask to pattern nitride layer 11, using nitride layer 11 as a mask to pattern polycrystalline silicon layer 10. Then, a nitride layer having a thickness of about 50 to about 100 nm is formed on oxide layer 9 so as to cover nitride layer 11 and polycrystalline silicon layer 10. Anisotropical etching is performed on this nitride layer. Thus, nitride spacer 12 is formed.

Figure 4:
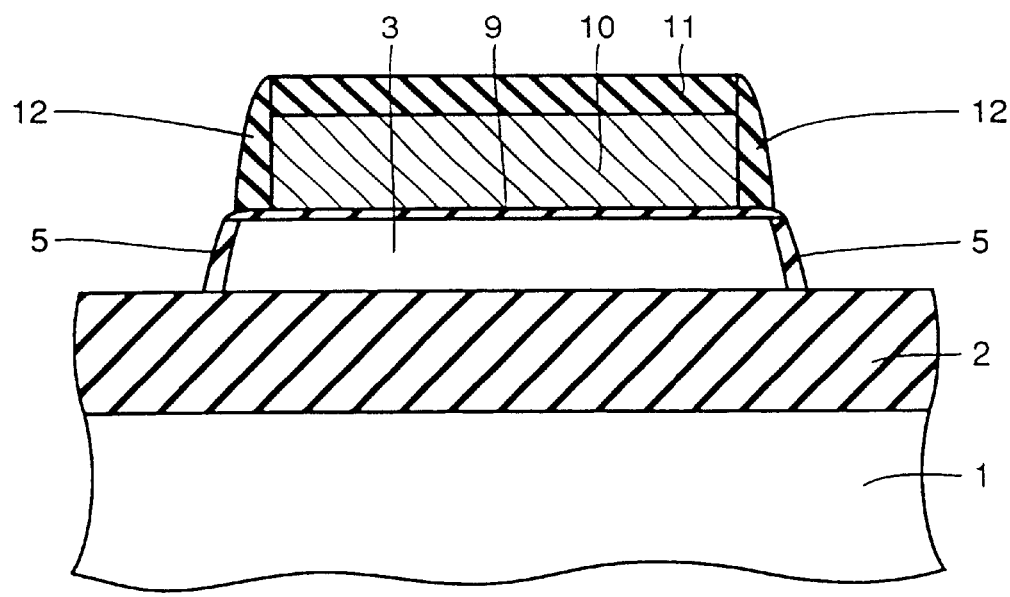

Referring next to FIG. 4, using nitride layer 11 and nitride spacer 12 as a mask, oxide layer 9 and SOI layer 3 are patterned successively. Thereafter, the sidewall of SOI layer 3 is subjected to thermal oxidation in order to eliminate the etching damage caused upon this patterning. Thus, sidewall oxide layer 5 is formed at the edge portion of SOI layer 3.

Figure 5:
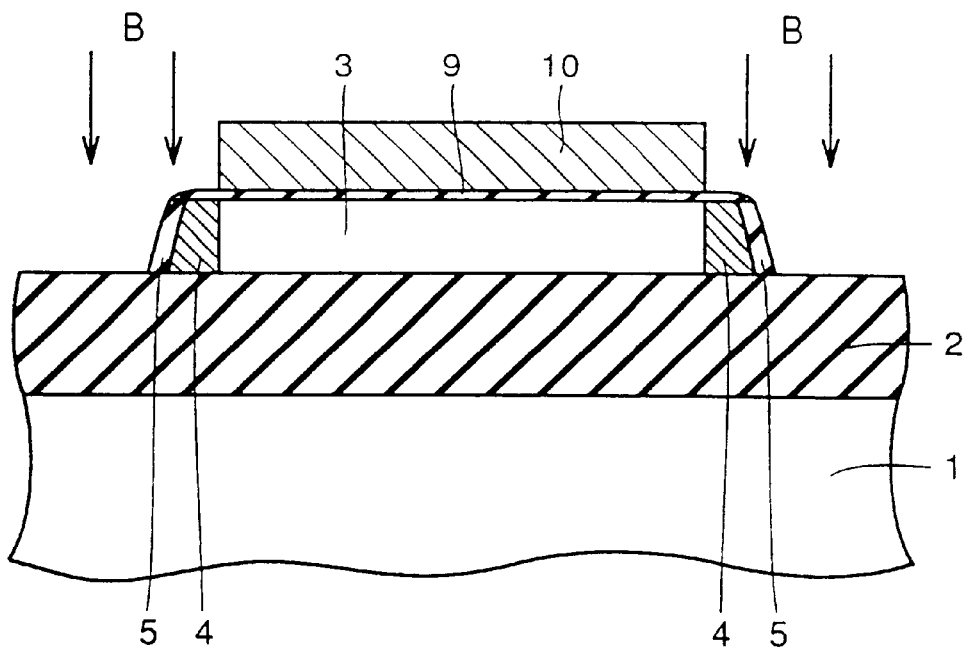

Thereafter, by etching with hot phosphoric acid or the like, nitride layer 11 and nitride spacer 12 are removed. Accordingly, oxide layer 9 placed on the region in the vicinity of the edge portion of SOI layer 3 is selectively exposed. At this state, as shown in FIG. 5, impurity for forming channel stopper region 4 is implanted to the portion in the vicinity of the edge portion of SOI layer 3, using polycrystalline silicon layer 10 as a mask. Here, implantation of boron (B) is performed to the portion in the vicinity of the edge portion of SOI layer 3. When CMOS (Complementary Metal Oxide Semiconductor) is formed, it is required to cover the region where pMOS transistor is formed by, for example, photoresist upon performing implantation of boron to the above-described nMOS transistor.

As described above, since impurity (boron) for forming channel stopper region 4 is implanted into SOI layer 3 after formation of sidewall oxide layer 5, drawing out of the impurity introduced into channel stopper region 4 by formation of sidewall oxide layer 5 can be suppressed effectively. Thus, it is possible to suppress reduction in the impurity concentration in channel stopper region 4 effectively. In addition, since impurity (boron) can be implanted in a self-aligned manner in the vicinity of the edge portion of SOI layer 3 which was covered by nitride spacer 12 as shown in FIG. 5, formation of channel stopper region 4 can be ensured. In other words, it can be made almost certain that channel stopper region 4 containing impurity with a high concentration is formed in the vicinity of the edge portion of SOI layer 3. Thus, reduction in the threshold voltage Vth of the parasitic MOS transistor in the vicinity of the edge portion of SOI layer 3 can be suppressed effectively.

Figure 6:
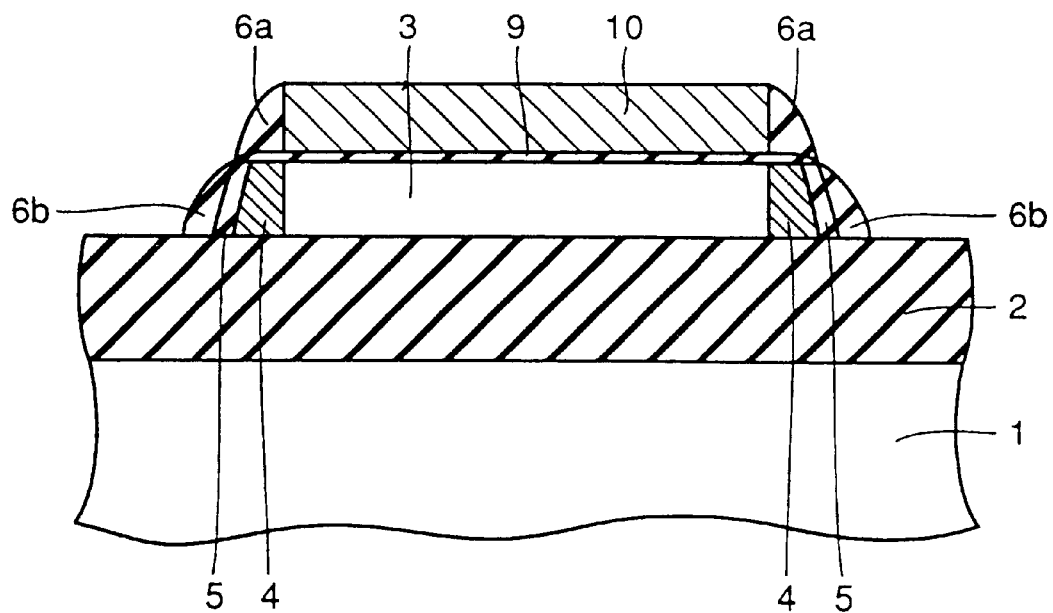

Referring next to FIG. 6, an insulation layer (not shown) of oxide, nitride or the like is formed by CVD (Chemical Vapor Deposition) on buried oxide layer 2 so as to cover polycrystalline silicon layer 10 and SOI layer 3. Then, this insulation layer is subjected to anisotropical etching. Thus, protruded insulation layer 6a and sidewall insulation layer 6b are formed simultaneously. At this time, since polycrystalline silicon layer 10 is formed on SOI layer 3, damage is scarcely left at the surface of SOI layer 3 by this anisotropical etching.

Figure 7:
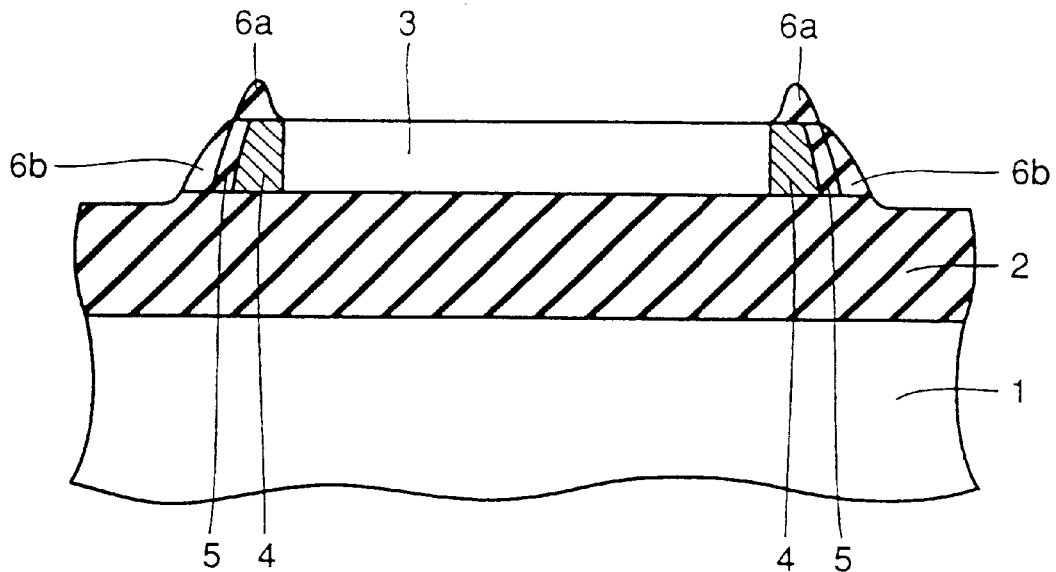

Thereafter, referring to FIG. 7, polycrystalline silicon layer 10 and oxide layer 9 are removed by, for example, isotropic etching. At this time, since the edge portion of SOI layer 3 is protected by sidewall oxide layer 5 and sidewall insulation layer 6b, formation of recess portion immediately under the edge portion of SOI layer 3 can be prevented effectively. Thus, it is possible to prevent insulation breakdown of the gate insulation layer in the vicinity of the edge portion of SOI layer 3 effectively.

As described above, after exposure of the surface of SOI layer 3, gate insulation layer 7 with a thickness of about 6 to about 12 nm is formed on the surface of SOI layers 3 using, for example, thermal oxidation, CVD or the like, and gate electrode 8 is formed on this gate insulation layer 7. By carrying out the above process, the semiconductor device shown in FIG. 1 is formed.

Figure 12:
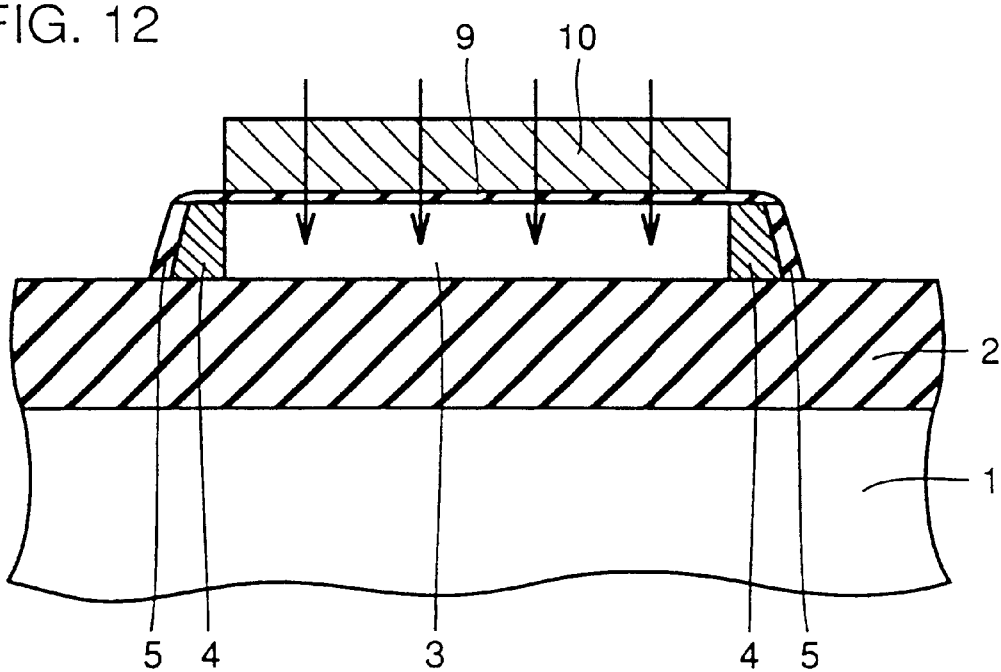
FIG. 12 is a cross-sectional view showing how channel doping is performed in Embodiments 1 and 2.

When gate insulation layer 7 is formed by CVD, drawing out of the impurity from the channel stopper region 4 upon formation of gate insulation layer 7 can be suppressed. As shown in FIG. 12, it is also possible to perform channel doping after the formation of channel stopper region 4 with use of the same mask as the one employed upon implantation of boron for forming channel stopper region 4. In this case, boron needs to be implanted into SOI layer 3 by the enough energy for penetrating polycrystalline silicon layer 10. By thus performing channel doping with use of the same mask as the one used for formation of channel stopper region 4, the manufacturing process can be simplified. The above-described channel doping may be formed before formation of channel stopper region 4. In addition, when CMOS is formed, this channel doping can be performed with PMOS formation region still covered with the above-described photoresist. Similarly to the case of forming channel stopper region 4, concept of such channel doping can be applied not only to pMOS transistor but also to each of the embodiments described in the following.

[Embodiment 2]

Figure 8:
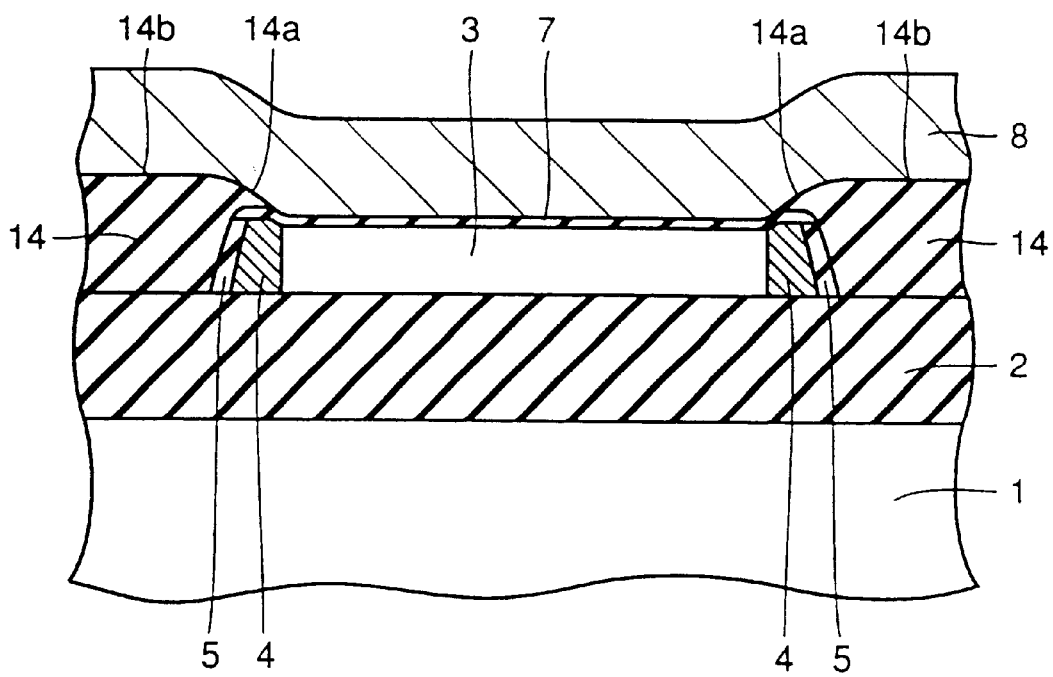
FIG. 8 is a cross-sectional view showing a semiconductor device according to Embodiment 2 of the present invention.

Referring next to FIGS. 8 to 11, Embodiment 2 according to the present invention will now be described. FIG. 8 is a cross-sectional view showing a semiconductor device according to Embodiment 2 of the present invention.

Referring to FIG. 8, an oxide layer 14 is formed to extend from a region above channel stopper region 4 to a region above buried oxide layer 2. This oxide layer 14 has a sloped upper surface 14a immediately above channel stopper region 4 as well as an even upper surface 14b above buried oxide layer 2. A gate electrode 8 extends above SOI layer 3 over oxide layer 14. By providing such oxide layer 14, it is possible to protect the edge portion of SOI layer 3 while keeping away gate electrode 8 from the edge portion of SOI layer 3. As a result, reduction in threshold voltage Vth of a parasitic MOS transistor at the edge portion of SOI layer 3 can be suppressed, while effectively suppressing insulation breakdown of the gate insulation layer in the vicinity of the edge portion of SOI layer 3.

Figure 9:
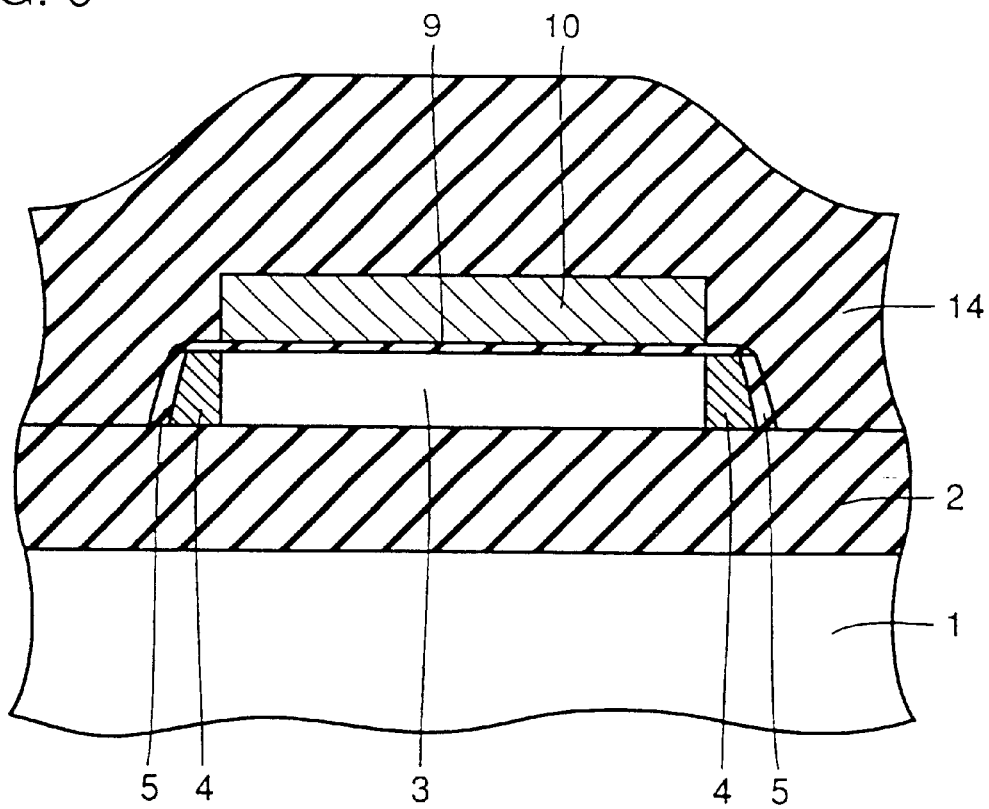
FIGS. 9 to 11 are cross-sectional views showing the first to third steps in the manufacturing process of the semiconductor device according to Embodiment 2.
Figure 10:
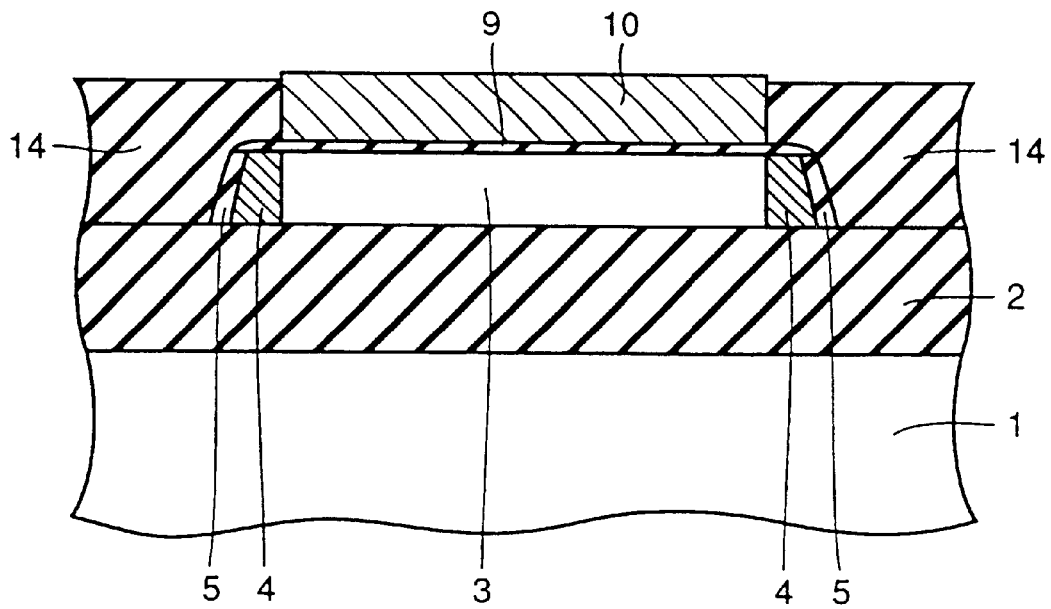
Figure 11:
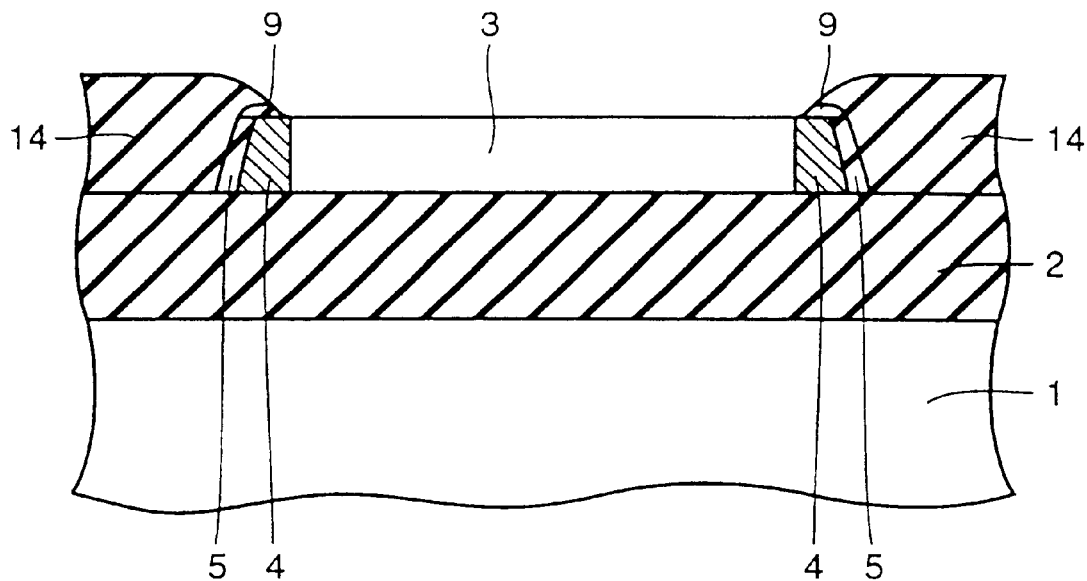

Referring next to FIGS. 9 to 11, a method of manufacturing the semiconductor device shown in FIG. 8 will be described. FIGS. 9 to 11 are cross-sectional views showing first to third steps in the manufacturing process of the semiconductor device shown in FIG. 8.

Referring first to FIG. 9, a process similar to the process in the above-described Embodiment 1 is carried on until channel stopper region 4 is formed. Then, using CVD, an oxide layer 14 with a thickness of about 1 μm is formed to cover polycrystalline silicon layer 10 and SOI layer 3.

Then, the upper surface of oxide layer 14 is subjected to process of CMP (Chemical Mechanical Polishing). As a result, as shown in FIG. 10, the upper surface of oxide layer 14 is made even while the upper surface of polycrystalline silicon layer 10 is exposed. At this time, polycrystalline silicon layer 10 functions as a stopper for CMP, and thus polishing accuracy by the process of CMP is improved. Instead of CMP, an etch back method can also be employed, which also applies to the following embodiments.

Referring next to FIG. 11, polycrystalline silicon layer 10 is removed by, for example, isotropic etching, followed by wet etching to selectively remove oxide layer 9. Thus, the surface of SOI layer 3 is exposed selectively. Thereafter, gate insulation layer 7 and gate electrode 8 are formed in a manner similar to that of the above-described Embodiment 1. By carrying out the above-described process, the semiconductor device shown in FIG. 8 is formed.

Figure 13:
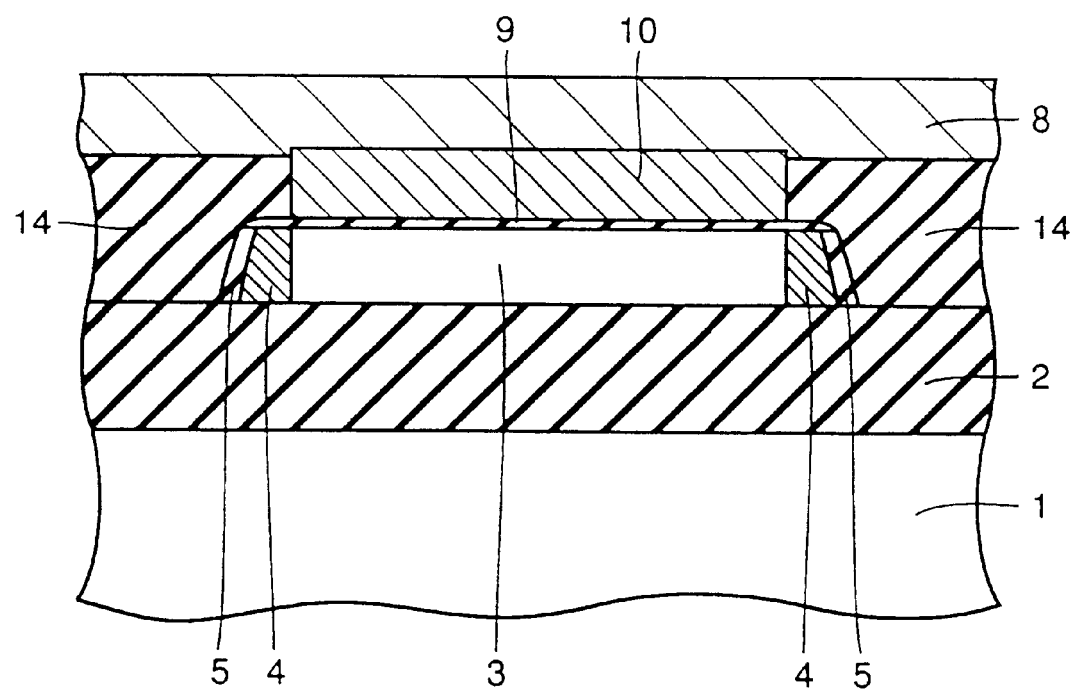
FIG. 13 is a cross-sectional view showing a semiconductor device according to a modification of Embodiment 2.

Referring next to FIG. 13, description will now be made for a modification of Embodiment 2 described above. FIG. 13 is a cross-sectional view showing a semiconductor device according to a modification of Embodiment 2.

Referring to FIG. 13, in this modification, polycrystalline silicon layer 10 which has been employed as a mask layer is used as a portion of gate electrode 8. Thus, it is possible to omit the steps of etching polycrystalline silicon layer 10 and oxide layer 9, and the manufacturing process can be simplified as compared to the process in the above-described Embodiment 2.

[Embodiment 3]

Figure 14:
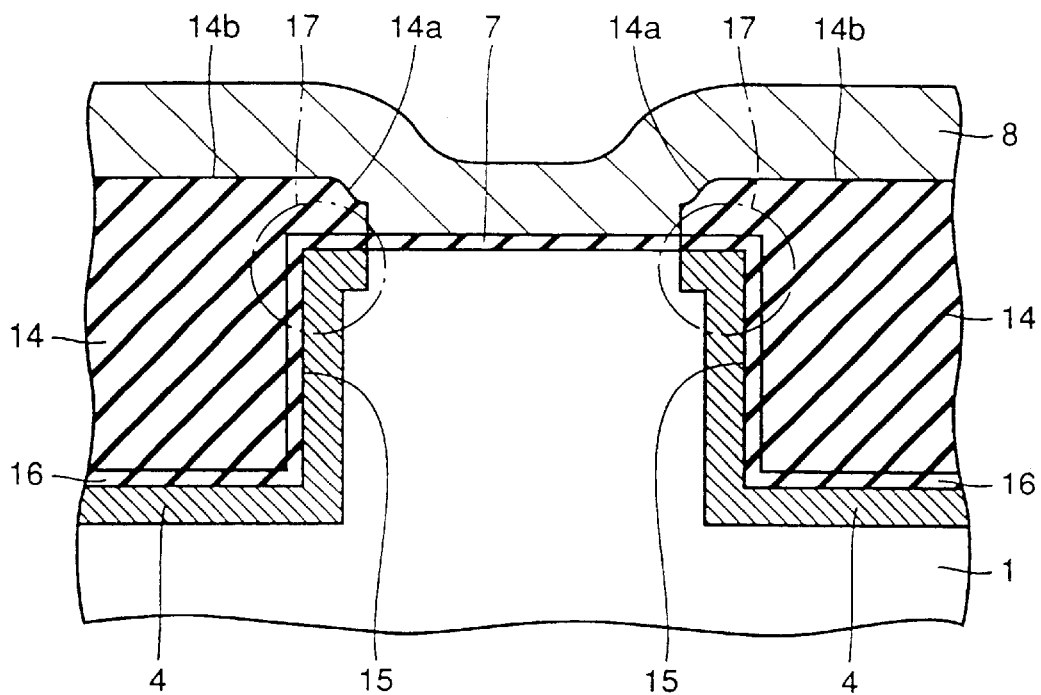
FIG. 14 is a cross-sectional view showing a semiconductor device according to Embodiment 3 of the present invention.

Referring next to FIGS. 14 to 19, Embodiment 3 of the present invention will be described. FIG. 14 is a cross-sectional view showing a semiconductor device according to Embodiment 3 of the present invention.

This Embodiment 3 is implemented by applying the concept of the above-described Embodiment 2 to a device formed immediately on the main surface of a silicon substrate. This concept of Embodiment 2 can be similarly applied to Embodiment 4 which will be described later.

Referring to FIG. 14, a pair of trenches 15 are formed, spaced apart from each other, at the main surface of silicon substrate 1. An oxide layer 16 is formed on the inner surface of trench 15. A channel stopper region 4 is extended along the inner surface of trench 15 and reaches the upper end corner portion 17 of sidewall of trench 15. A gate insulation layer 7 is formed on the main surface of the silicon substrate 1 sandwiched by the channel stopper regions 4, and a gate electrode 8 is formed on this gate insulation layer 7. Gate electrode 8 extends to the region over oxide layer 14 which has a sloped upper surface 14a above channel stopper region 4 as well as an even upper surface 14b above trench 15.

Referring next to FIGS. 15 to 19, description will be made for a method of manufacturing the semiconductor device having the above-described structure. FIGS. 15 to 19 are cross-sectional views showing first to fifth steps in the manufacturing process of the semiconductor device shown in FIG. 14.

Figure 15:
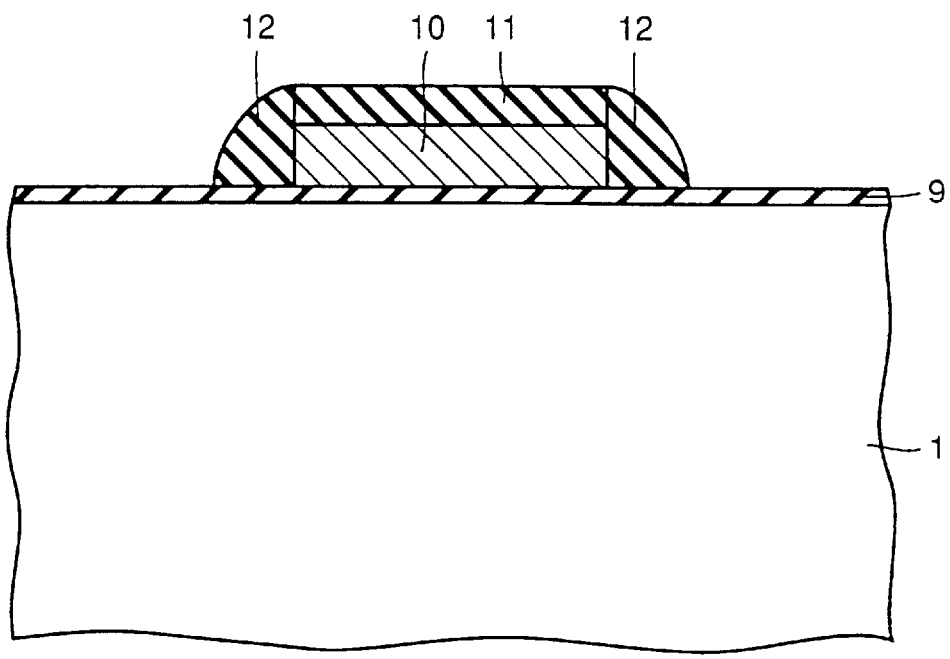
FIGS. 15 to 19 are cross-sectional views showing the first to fifth steps in the manufacturing process of the semiconductor device according to Embodiment 3.

Referring first to FIG. 15, oxide layer 9, polycrystalline silicon layer 10, nitride layer 11 and nitride spacer 12 are formed on the main surface of silicon substrate 1 by a method similar to that of the above-described Embodiment 1.

Figure 16:
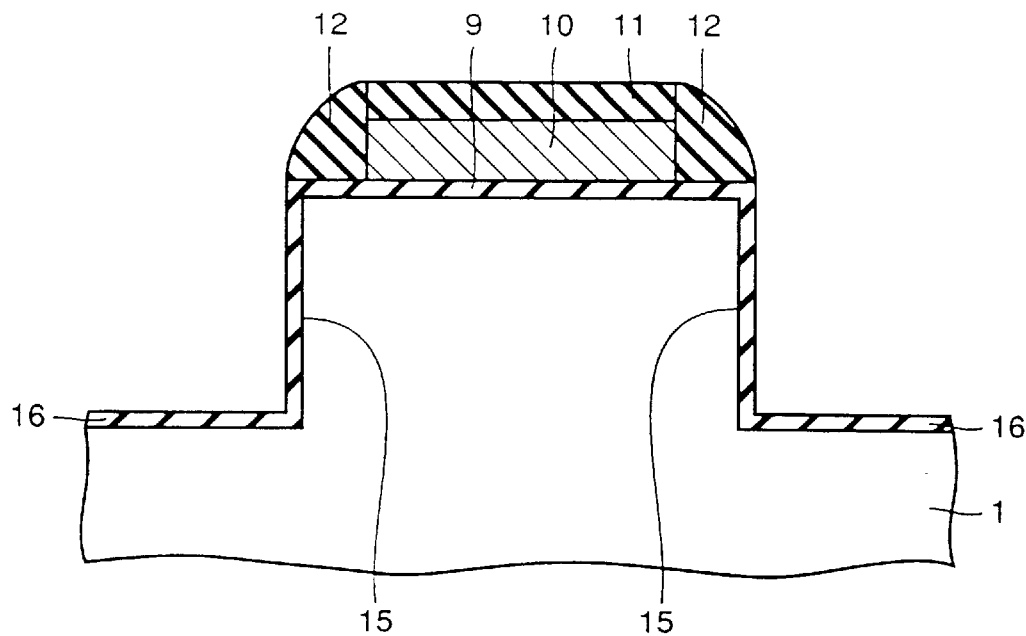

Referring next to FIG. 16, using nitride layer 11 and nitride spacer 12 as a mask, the main surface of silicon substrate 1 is etched to form trench 15. The depth of trench 15 may be, for example, about 250 nm to about 300 nm. Then, by performing thermal oxidation to the inner surface of trench 15, oxide layer 16 is formed. Thus, it is possible to eliminate the etching damage owing to the formation of trench 15.

Figure 17:
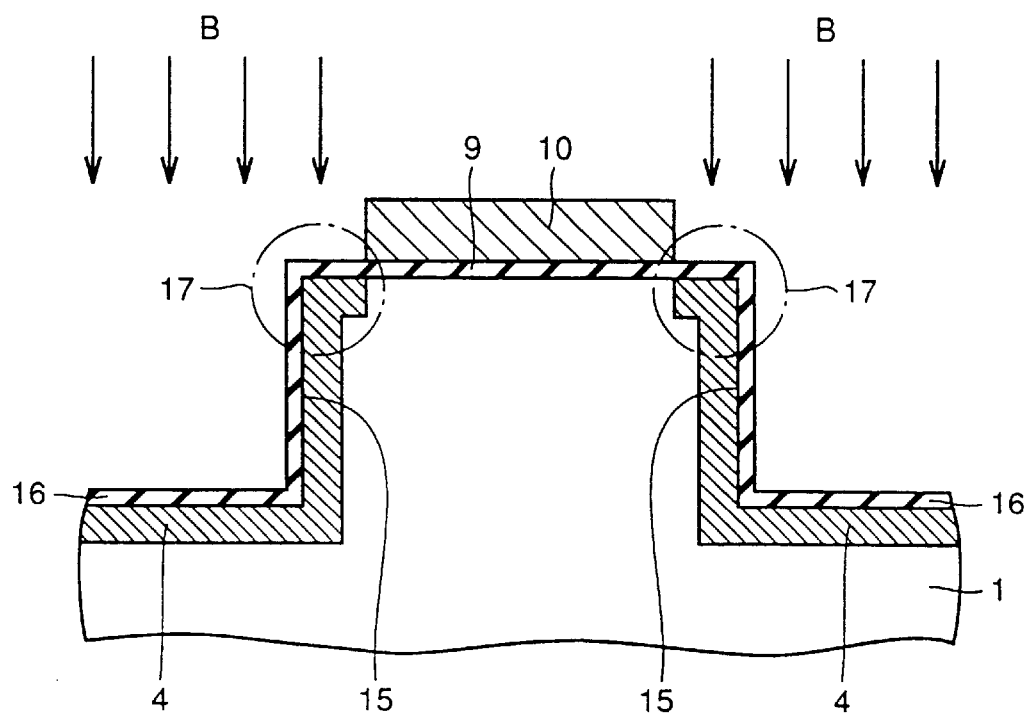

Then, referring to FIG. 17, nitride layer 11 and nitride spacer 12 are removed by a method similar to that of the above-described Embodiment 1. Thereafter, using polycrystalline silicon layer 10 as a mask, a p type impurity such as boron is implanted to the inner surface of trench 15 and to the region in the vicinity of upper end corner portion 17 of sidewall of trench 15. Thus, channel stopper region 4 is formed. At this time, since oxide layer 16 is formed before the formation of channel stopper region 4, the p type impurity introduced into channel stopper region 4 can be prevented effectively from being drawn out by oxide layer 16. Accordingly, channel stopper region 4 containing impurity of a high concentration can be formed.

Figure 18:
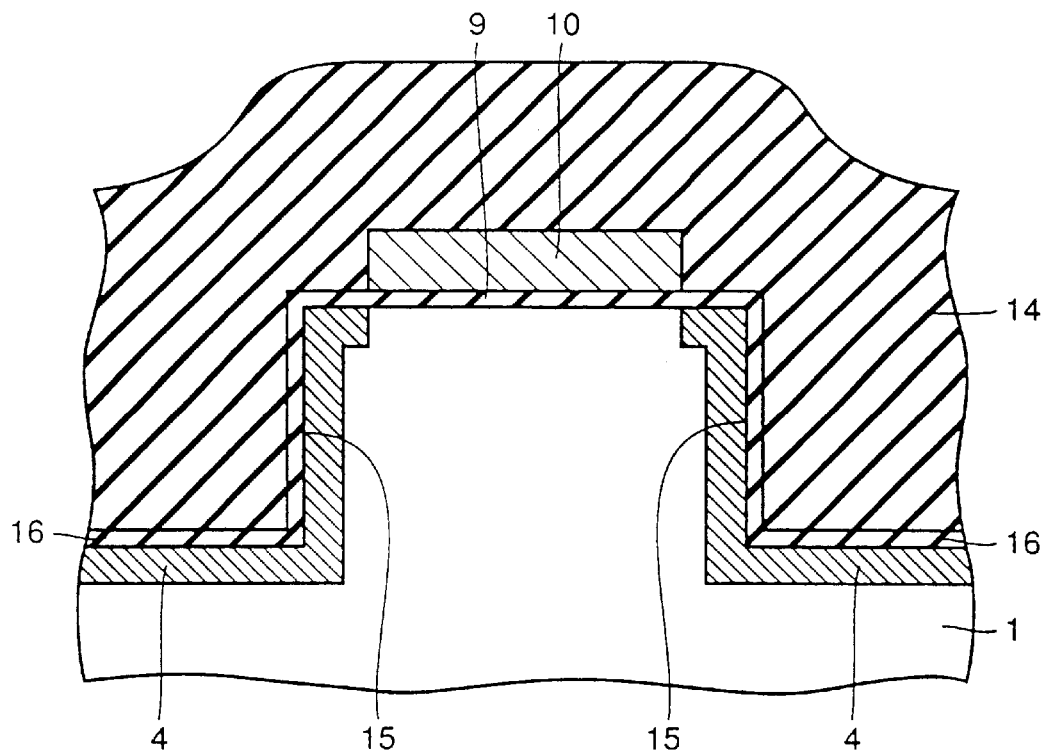
Figure 19:
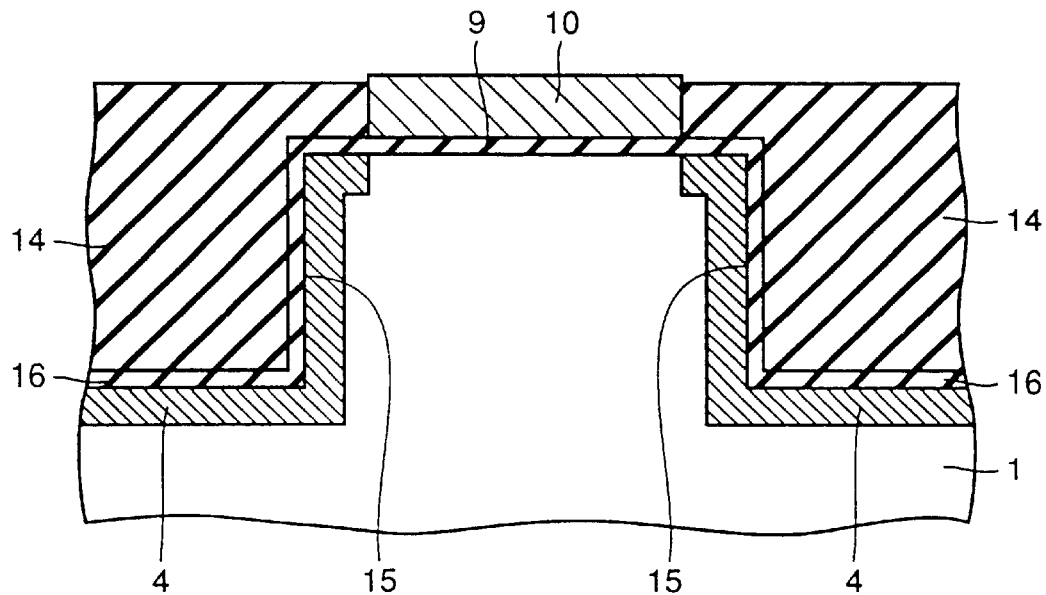

Thereafter, as shown in FIG. 18, oxide layer 14 is formed to cover trench 15 and polycrystalline silicon layer 10 by a method similar to the method employed in the above-described Embodiment 2. Then, process of CMP is performed on this oxide layer 14. Thus, the upper surface of polycrystalline silicon layer 10 is exposed as shown in FIG. 19. Thereafter, by carrying out the process similar to that of Embodiment 2 described above, the semiconductor device in FIG. 14 is formed.

[Embodiment 4]

Figure 20:
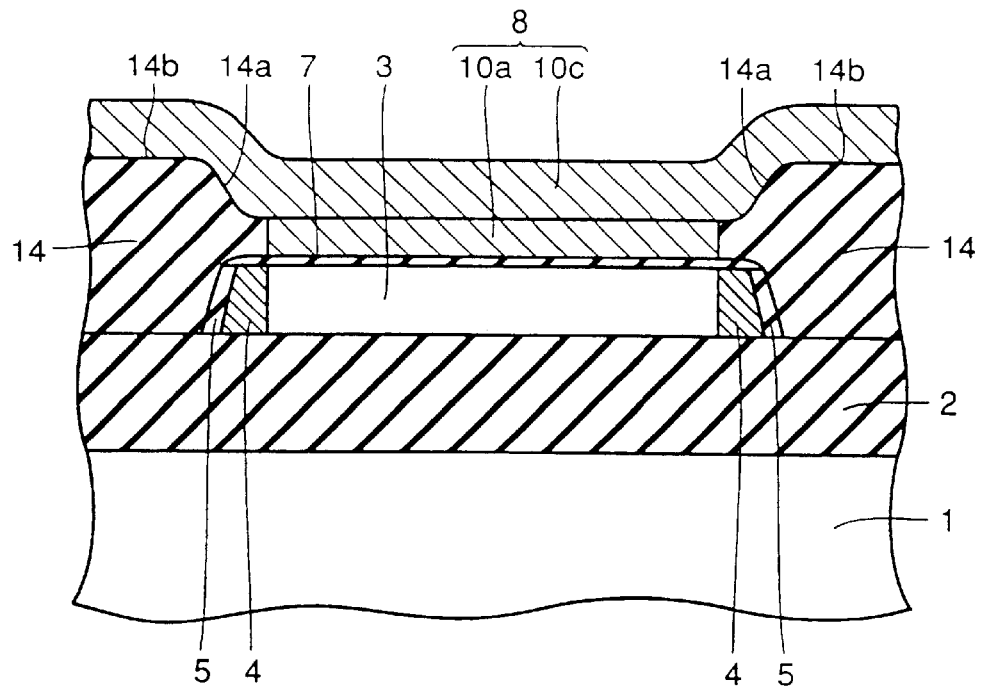
FIG. 20 is a cross-sectional view showing a semiconductor device according to Embodiment 4 of the present invention.

Referring next to FIGS. 20 to 26, Embodiment 4 according to the present invention and a modification thereof will now be described. FIG. 20 is a cross-sectional view showing a semiconductor device according to Embodiment 4 of the present invention.

Referring to FIG. 20, in this Embodiment 4, gate electrode 8 is formed of a stacked structure including a first polycrystalline silicon layer 10a and a third polycrystalline silicon layer 10c. Oxide layer 14 is formed to extend from a region on a channel stopper region 4 to a region on a buried oxide layer 2, having a sloped upper surface 14a located above channel stopper region 4 as well as an even upper surface 14b located above buried oxide layer 2. Sloped upper surface 14a is inclined to be apart from the upper surface of SOI layer 3 upwards as it extends toward the edge portion of SOI layer 3. Even upper surface 14b is formed adjacent to this sloped upper surface 14a. Third polycrystalline silicon layer 10c of gate electrode 8 is extended over sloped upper surface 14a and even upper surface 14b. The level of even upper surface 14b from the upper surface of SOI layer 3 is set to be higher than the level of the upper surface of first polycrystalline silicon layer 10a from that of SOI layer 3. Accordingly, gate electrode 8 can be kept away from the edge portion of SOI layer 3 effectively. Thus, it is possible to effectively suppress the reduction in the threshold voltage Vth of parasitic MOS transistor at the edge portion of SOI layer 3.

Referring next to FIGS. 21 to 24, a method of manufacturing a semiconductor device shown in FIG. 20 will now be described. FIGS. 21 to 24 are cross-sectional views showing first to fourth steps in the manufacturing process of semiconductor device shown in FIG. 20.

Figure 21:
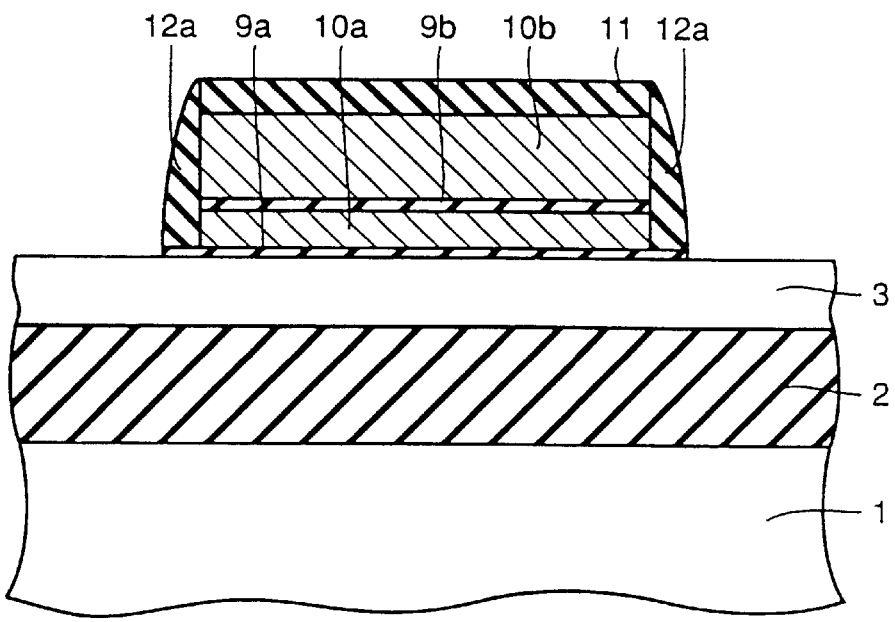
FIGS. 21 to 24 are cross-sectional views showing the first to fourth steps in the manufacturing process of the semiconductor device according to Embodiment 4.

Referring to FIG. 21, on the surface of SOI layer 3 formed by a method similar to that of Embodiment 1, an oxide layer 9a, a first polycrystalline silicon 10a, oxide layer 9b, a second polycrystalline silicon layer 10b and nitride layer 11 are formed successively. Then, a photoresist (not shown) patterned to obtain the shape of an element formation region is formed on this nitride layer 11. Using this photoresist as a mask, nitride layer 11, second polycrystalline silicon layer 10b, oxide layer 9b and first polycrystalline silicon layer 10a are patterned successively. The above-described photoresist is removed, and thereafter, a nitride layer (not shown) is formed on the entire surface and anisotropic etching is performed on this nitride layer. Thus, a nitride spacer 12a is formed.

Figure 22:
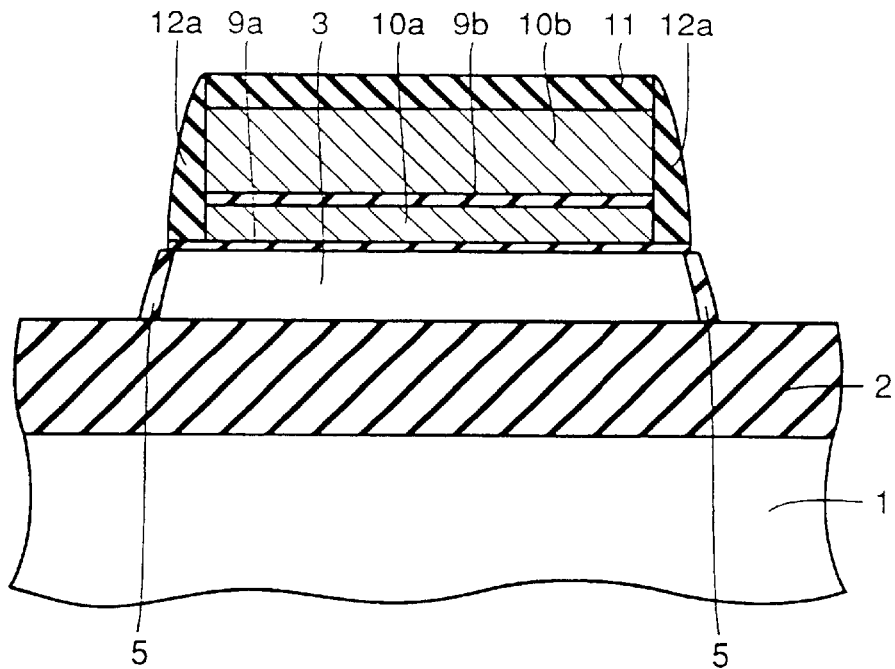

Referring next to FIG. 22, using nitride layer 11 and nitride spacer 12a as a mask, the sidewall of SOI layer 3 is subjected to heat treatment in an oxide atmosphere. As a result, a sidewall oxide layer 5 is formed at the edge portion of SOI layer 3. Thereafter, nitride layer 11 and nitride spacer 12a are removed by hot phosphoric acid or the like.

Figure 23:
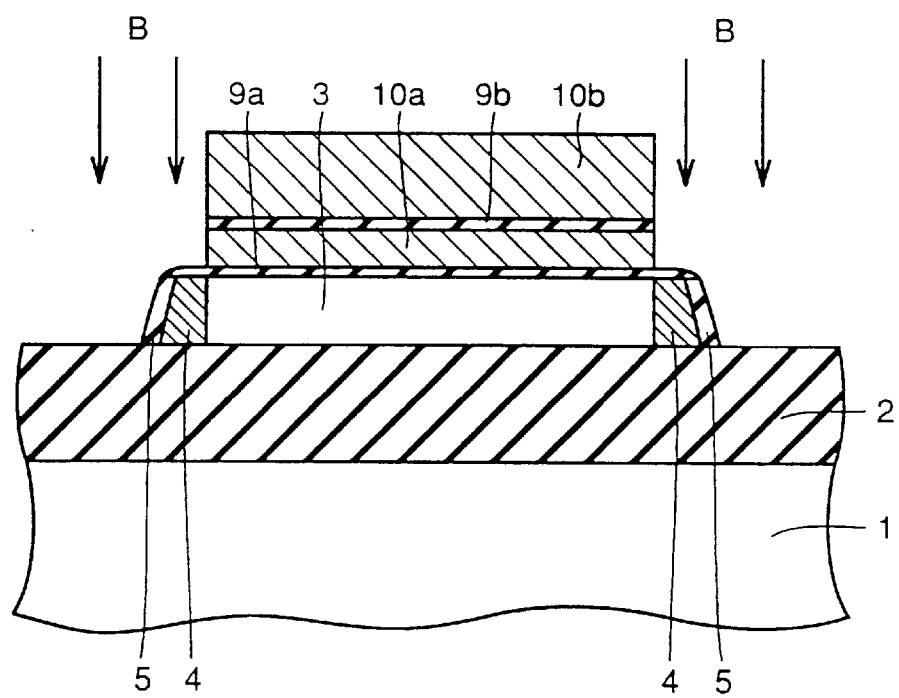
Figure 24:
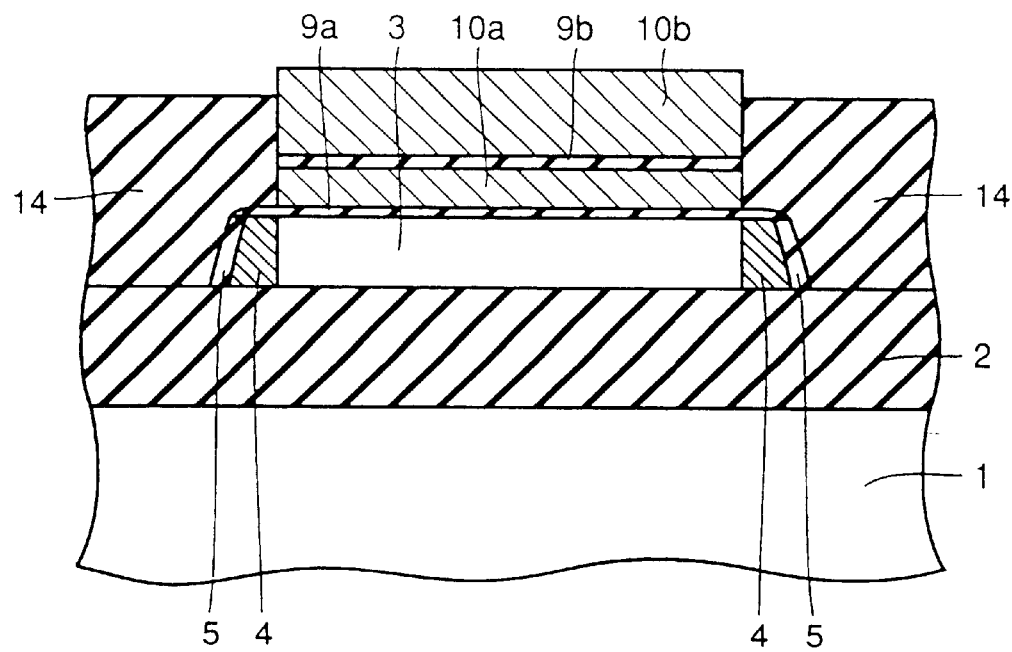

Thus, the surface of oxide layer 9a located in the vicinity of the edge portion of SOI layer 3 is exposed selectively, as shown in FIG. 23. Then, using second polycrystalline silicon layer 10b as a mask, ions of boron are implanted in the vicinity of the edge portion of SOI layer 3. As a result, a channel stopper region 4 is formed in the vicinity of the edge portion of SOI layer 3. Thus, in this embodiment also, it is possible to form channel stopper region 4 containing impurity of high concentration in a self-aligned manner as in the case of each embodiment described above.

Thereafter, oxide layer 14 of a thickness of about 1 μm is formed on the entire surface by CVD or the like. The upper surface of this oxide layer 14 is subjected to the process of CMP, thereby exposing the upper surface of second polycrystalline silicon layer 10b.

Second polycrystalline silicon layer 10b and oxide layer 9b are then etched away. Accordingly, sloped upper surface 14a is formed at oxide layer 14 located on channel stopper region 4 as shown in FIG. 20.

Thereafter, third polycrystalline silicon layer 10c is formed to extend from a region over first polycrystalline layer 10a to a region over oxide layer 14 by CVD or the like. Then, by patterning the third polycrystalline silicon layer 10c and first polycrystalline silicon layer 10a simultaneously, gate electrode 8 is formed, as shown in FIG. 20. By going through the process described above, the semiconductor device shown in FIG. 20 is formed.

Figure 25:
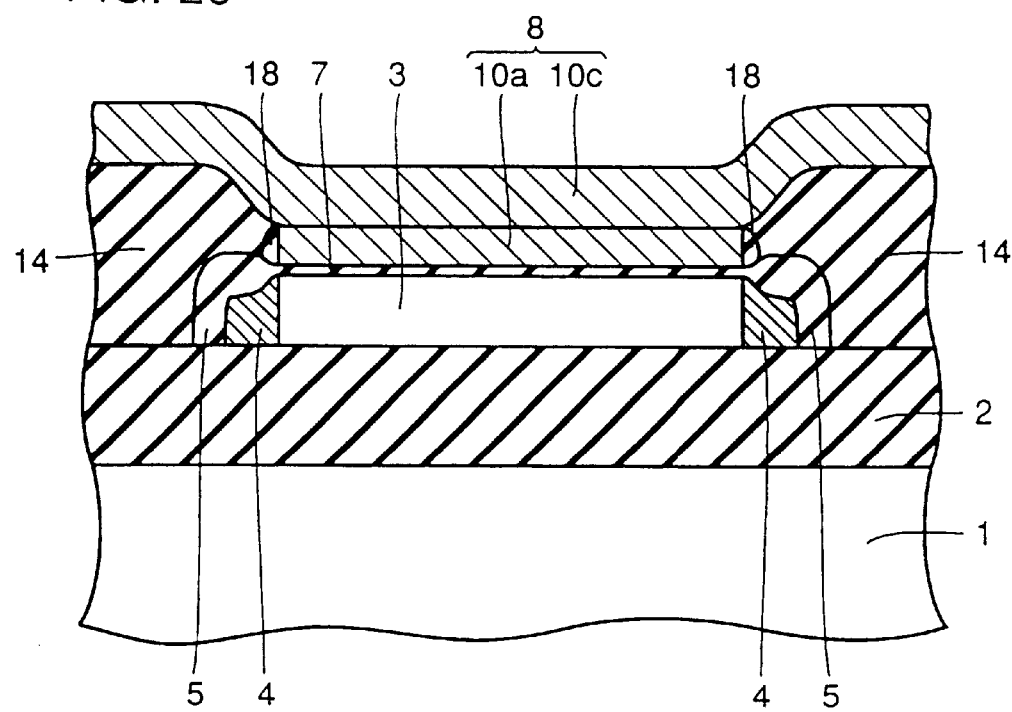
FIG. 25 is a cross-sectional view showing a semiconductor device according to a modification of Embodiment 4.
Figure 26:
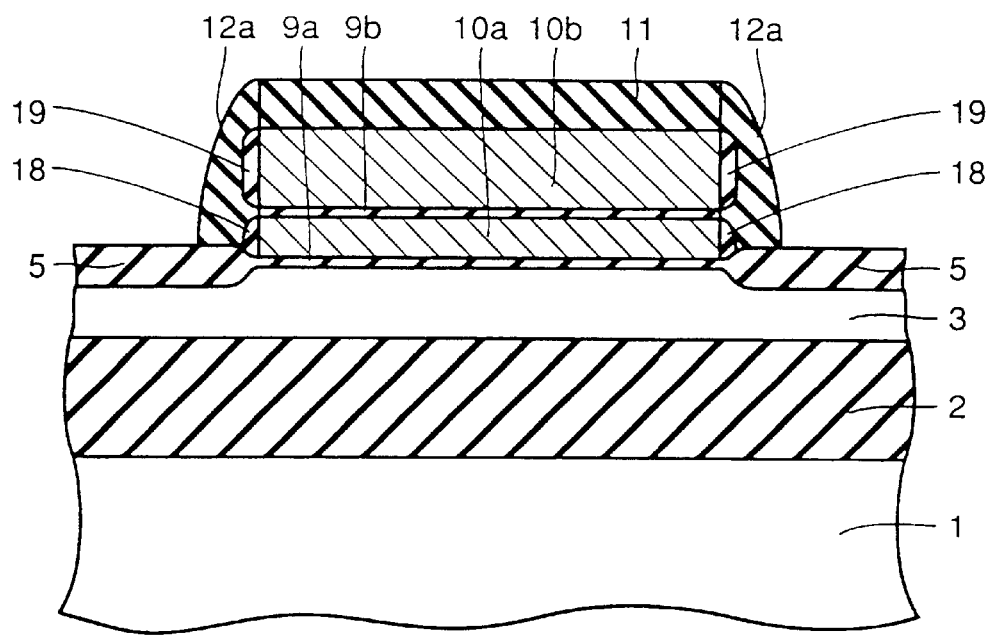
FIG. 26 is a cross-sectional view showing a characteristic manufacturing process in the semiconductor device of FIG. 25.

Referring next to FIGS. 25 and 26, description will be made on a modification of above-described Embodiment 4. FIG. 25 is a cross-sectional view showing a semiconductor device according to the modification of Embodiment 4.

Referring to FIG. 25, in this modification, a first sidewall oxide layer 18 is formed at a edge portion of a first polycrystalline silicon layer 10a, and thickness of sidewall oxide layer 5 is made larger than that of Embodiment 4 shown in FIG. 20. Other portions of the structure are substantially similar to those of the structure of the semiconductor device shown in FIG. 20.

Referring next to FIG. 26, the manufacturing process which is characteristic in the semiconductor device of FIG. 25 will be described. FIG. 26 is a cross-sectional view showing the manufacturing process which is characteristic in the semiconductor device of the above-described modification.

Referring to FIG. 26, a process similar to that of Embodiment 4 described above is carried on until a nitride layer 11 is formed. Using this nitride layer 11 as the mask, the edge portion of first and second polycrystalline silicon layers 10a, 10b is subjected to thermal oxidation. At this time, surface of SOI layer 3 also is selectively oxidized simultaneously. By performing thermal oxidation, it is possible to eliminate the etching damage caused at the time of patterning of first and second polycrystalline silicon layers 10a and 10b. Thereafter, process similar to that of Embodiment 4 described above is carried on to form the semiconductor device shown in FIG. 25.

[Embodiment 5]

Figure 27:
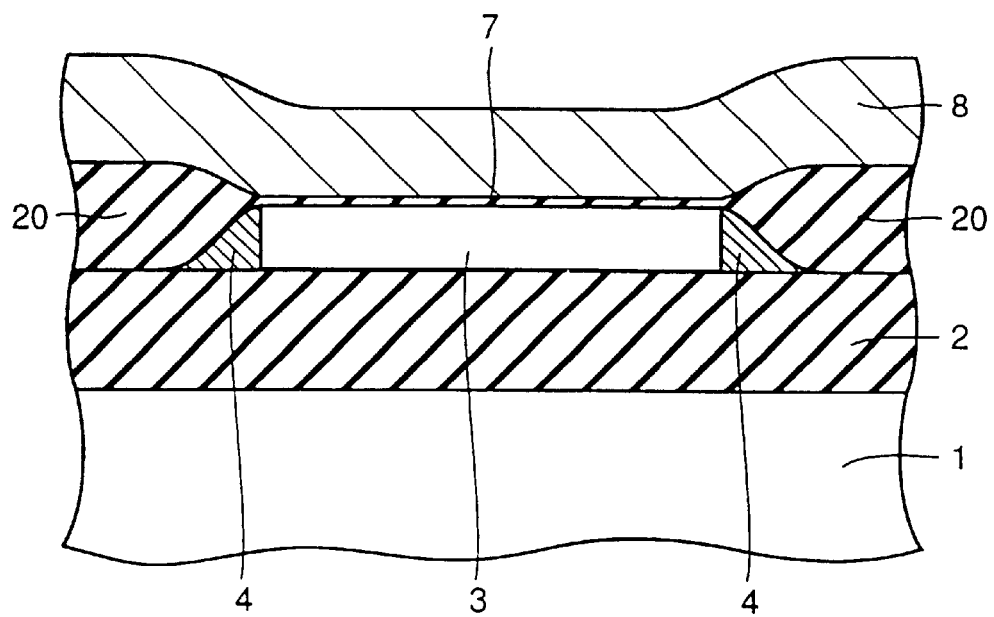
FIG. 27 is a cross sectional view showing a semiconductor device according to Embodiment 5 of the present invention.

Referring next to FIGS. 27 to 31, description will now be made for Embodiment 5 of the present invention. FIG. 27 is a cross-sectional view showing a semiconductor device according to Embodiment 5 of the present invention.

Referring to FIG. 27, an oxide layer 20 is formed selectively at SOI layer 3. This oxide layer 20 is formed by LOCOS, and is extended on channel stopper region formed in the vicinity of the edge portion of SOI layer 3. Gate electrode 8 is formed to be extended from a region over SOI layer 3 to a region over oxide layer 20.

Referring next to FIGS. 28 to 31, a method of manufacturing the semiconductor device of FIG. 27 will be described. FIGS. 28 to 31 are cross-sectional views showing first to fourth steps in the manufacturing process of the semiconductor device showing in FIG. 27.

Figure 28:
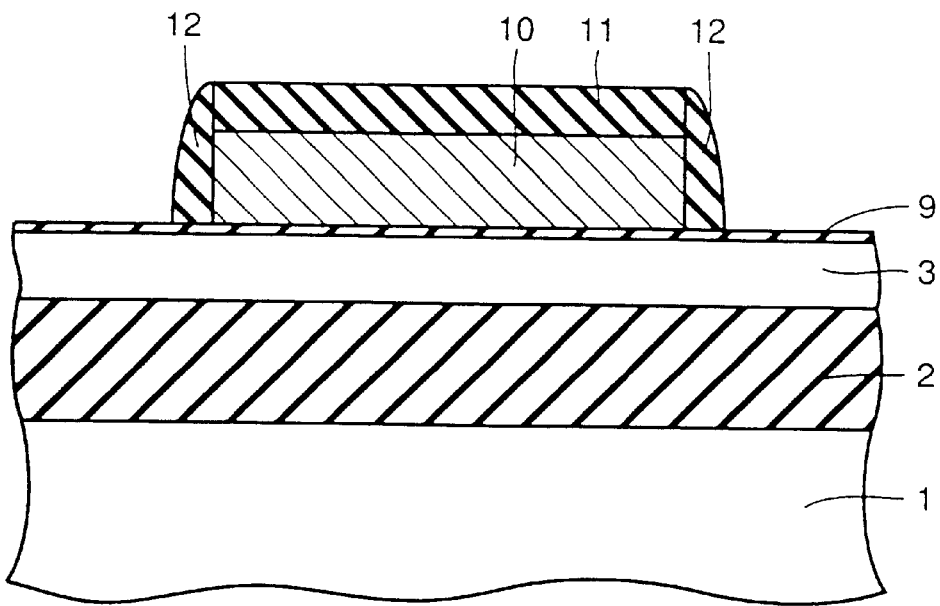
FIGS. 28 to 31 are cross-sectional views showing the first to fourth steps in the manufacturing process of semiconductor device according to Embodiment 5.

Referring first to FIG. 28, a process similar to that of Embodiment 1 described above is formed until nitride spacer 12 is formed. At this time, it is preferred that the thickness of oxide layer 9 is about 10 to about 30 nm, the thickness of polycrystalline silicon layer 10 is about 100 to about 300 nm, and thickness of nitride layer 11 is about 100 to about 300 nm.

Figure 29:
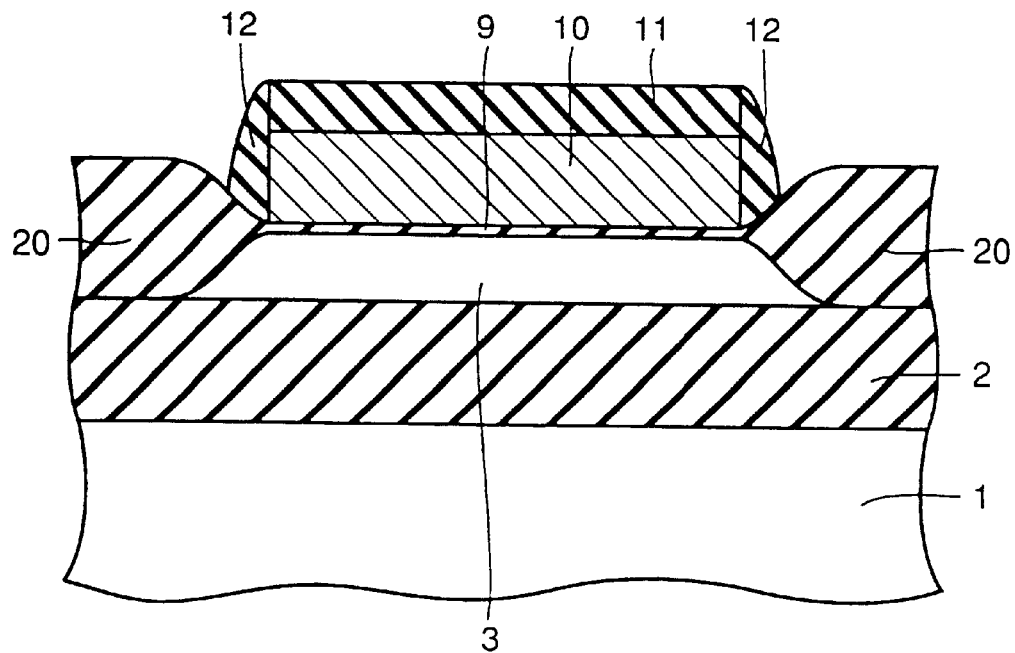
Figure 30:
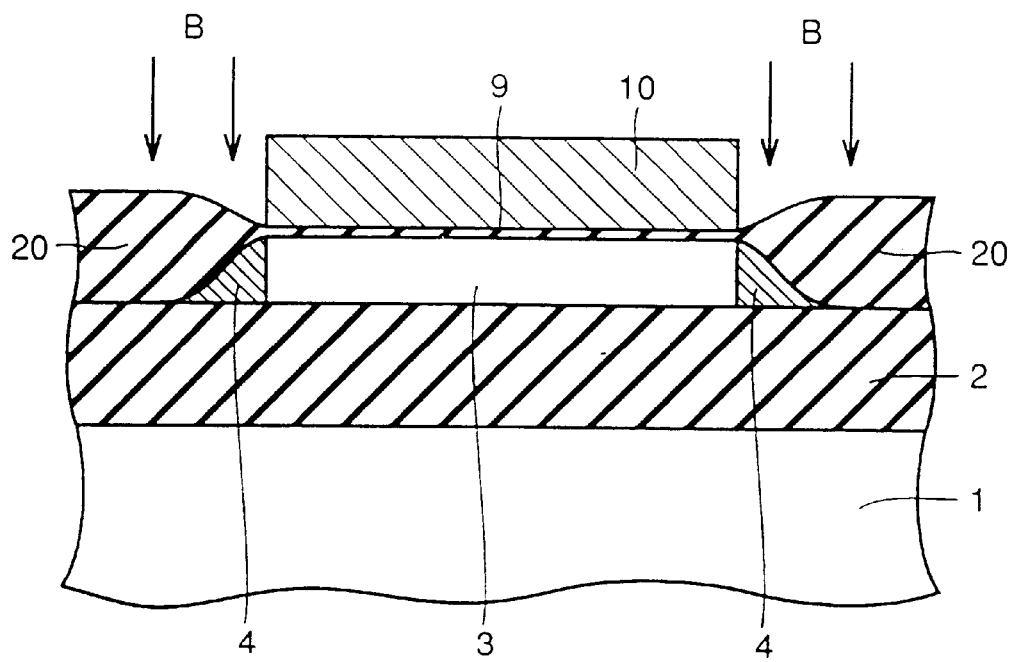

Thereafter, using nitride layer 11 and nitride spacer 12 as a mask, thermal oxidation is performed on SOI layer 3 under an oxide atmosphere. As a result, a so-called LOCOS oxidation takes place. An oxide layer 20 is formed selectively at SOI layer 3 to reach a buried oxide layer 2, as shown in FIG. 29.

Then, using hot phosphoric acid or the like, nitride layer 11 and nitride spacer 20 are removed. Thus, polycrystalline silicon layer 10 is left on the region of SOI layer 3 except for the region in the vicinity of the edge portion. Using this polycrystalline silicon layer 10 as a mask, ions of boron is implanted to the region in the vicinity of the edge portion of SOI layer 3. Accordingly, a channel stopper region 4 is formed in a self-aligned manner at the region in the vicinity of the edge portion of SOI layer 3. Since this channel stopper region 4 is formed after the formation of oxide layer 20, the impurity contained in channel stopper region 4 is scarcely drawn by this oxide layer 20. Accordingly, it is possible to prevent reduction in impurity concentration in channel stopper region 4 effectively.

Figure 31:
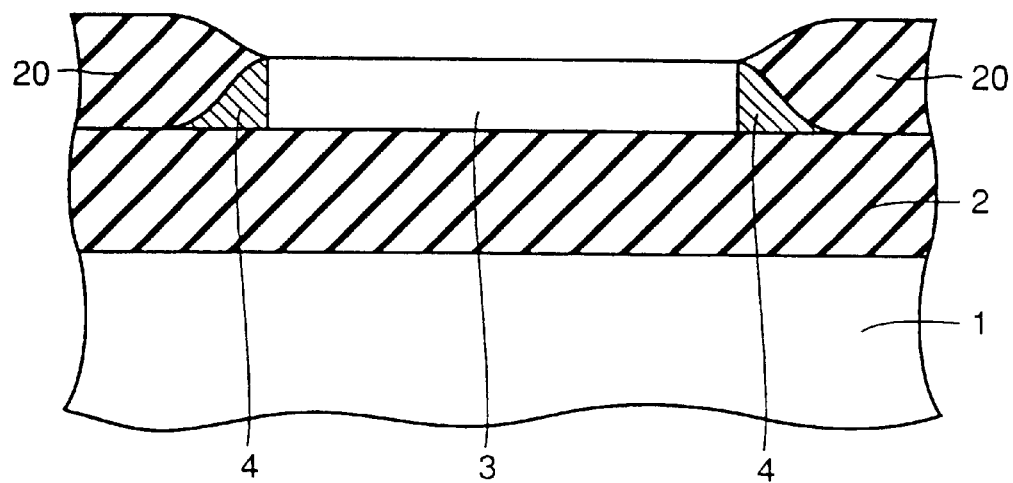

Then, polycrystalline silicon layer 10 and oxide layer 9 are etched away. As a result, the surface of SOI layer 3 is selectively exposed as shown in FIG. 31. Thereafter, gate insulation layer 7 is formed on the surface of SOI layer 3, and gate electrode 8 is formed on this gate insulation layer 7. By carrying out the process described above, the semiconductor device shown in FIG. 27 is formed.

[Embodiment 6]

Figure 32:
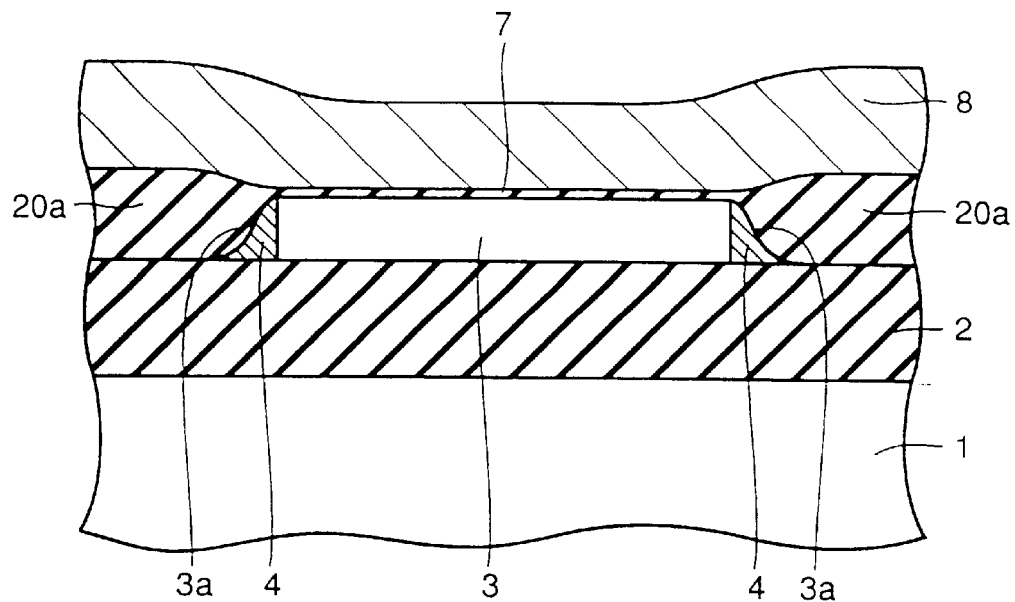
FIG. 32 is a cross-sectional view showing a semiconductor device according to Embodiment 6 of the present invention.

Referring next to FIGS. 32 to 40, description will be made for Embodiment 6 according to the present invention as well as for a modification thereof. FIG. 32 is a cross-sectional view showing the semiconductor device according to Embodiment 6 of the present invention.

Referring to FIG. 32, the slope of sidewall 3a of SOI layer 3 in this Embodiment 6 is steeper than in the above-described Embodiment 5. Accordingly, the shape of oxide layer 20a is slightly different from the shape of oxide layer 20. Other portions of the structure are substantially similar to those of the structure shown in FIG. 27. In this Embodiment 6, partial reduction in the film thickness in the vicinity of the edge portion of SOI layer 3 can be suppressed, as compared to the case of the above-described Embodiment 5, as shown in FIG. 32. Accordingly, formation of a parasitic MOS transistor of low threshold voltage Vth can be suppressed effectively as compared to Embodiment 5.

Referring next to FIGS. 33 to 38, description will be made for a method of manufacturing the semiconductor device according to Embodiment 6 having the structure as described above. FIGS. 33 to 38 are cross-sectional views showing first to sixth steps in the manufacturing process of the semiconductor device of FIG. 32.

Figure 33:
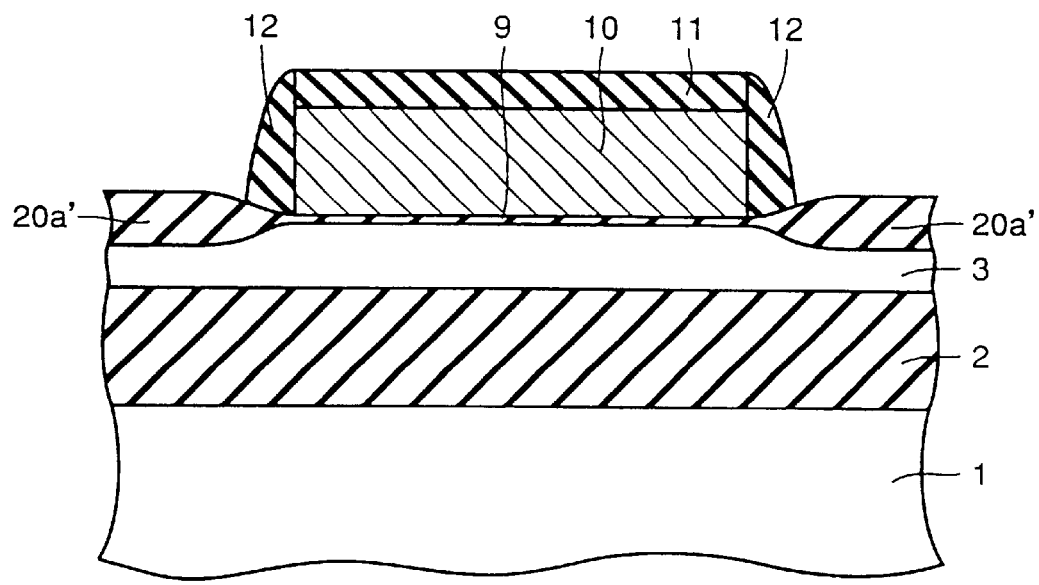
FIGS. 33 to 38 are cross-sectional views showing the first to sixth step in the manufacturing process of the semiconductor device according to Embodiment 6.

Referring first to FIG. 33, a process similar to the process in the above-described Embodiment 1 is carried on until a nitride spacer 12 is formed. Then, using nitride layer 11 and nitride spacer 12 as a mask, SOI layer 3 is oxidized effectively. Thus, oxide layer 20a' is formed selectively. At this time, the amount of oxidation is adjusted so that the thickness of SOI layer 3 left under oxide layer 20a', for example, would be about the half the initial thickness of SOI layer 3. More specifically, when the initial thickness of SOI layer 3 is about 100 nm, the amount of oxidation is set so that thickness of oxide layer 20a' would be about 110 nm. As a result, there would be SOI layer 3 with a thickness of about 50 nm left immediately under oxide layer 20a'.

Figure 34:
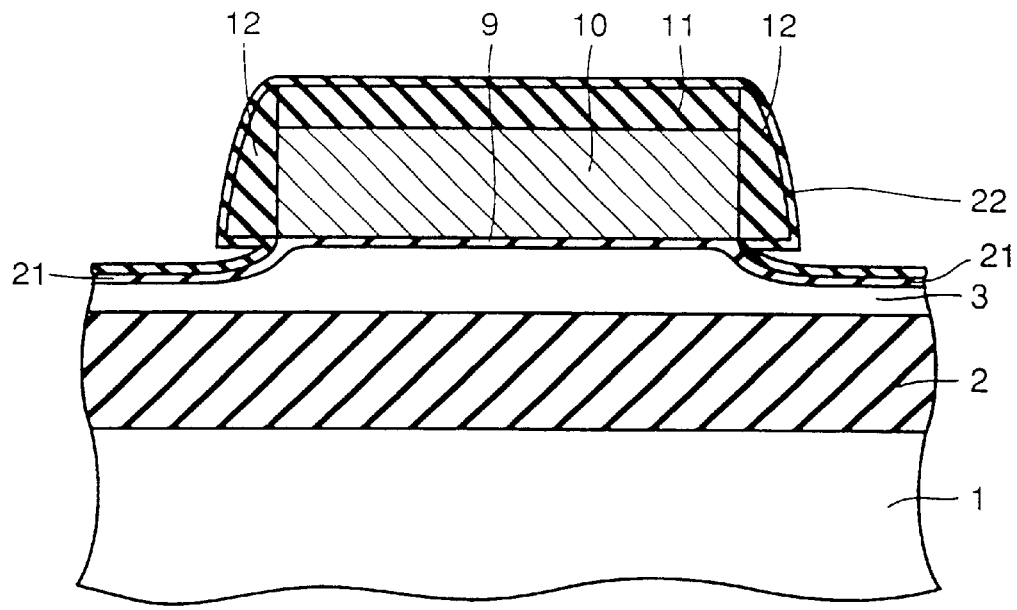

Then, after removing this oxide layer 20a' by wet etching or the like, nitride layer 11 and nitride spacer 12 are again employed as a mask to oxidize the surface of SOI layer 3 selectively, as shown in FIG. 34. Thus, a thin oxide layer 21 having a thickness of about 10 to about 30 nm is formed to extend to a region under-nitride spacer 12. Thereafter, by CVD or the like, a nitride layer 22 having a thickness of about 10 to about 20 nm is formed entirely on the surface. It should be noted that formation of this thin oxide layer 21 can be omitted.

Figure 35:
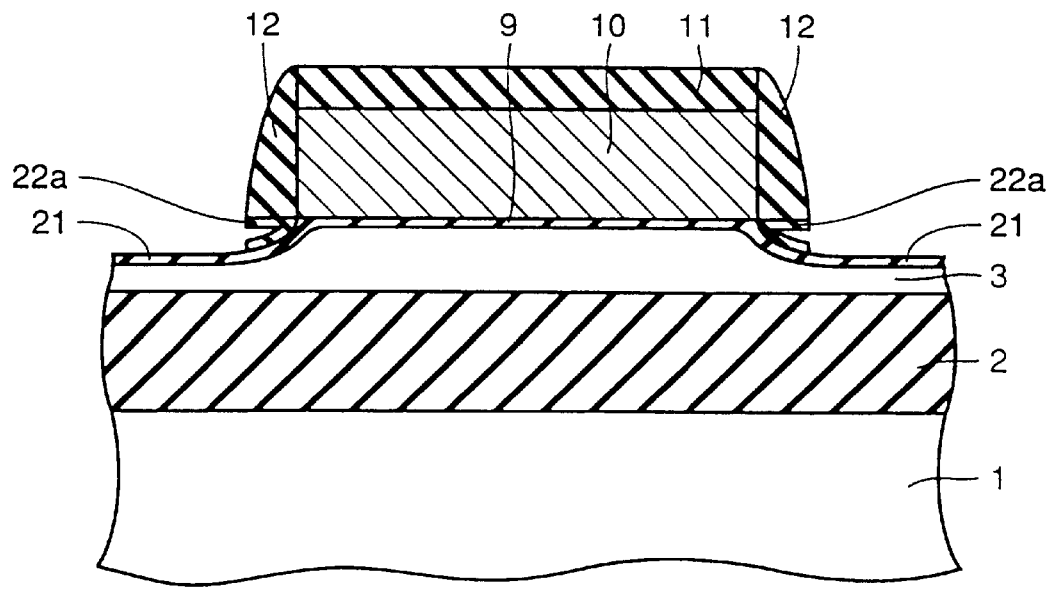
Figure 36:
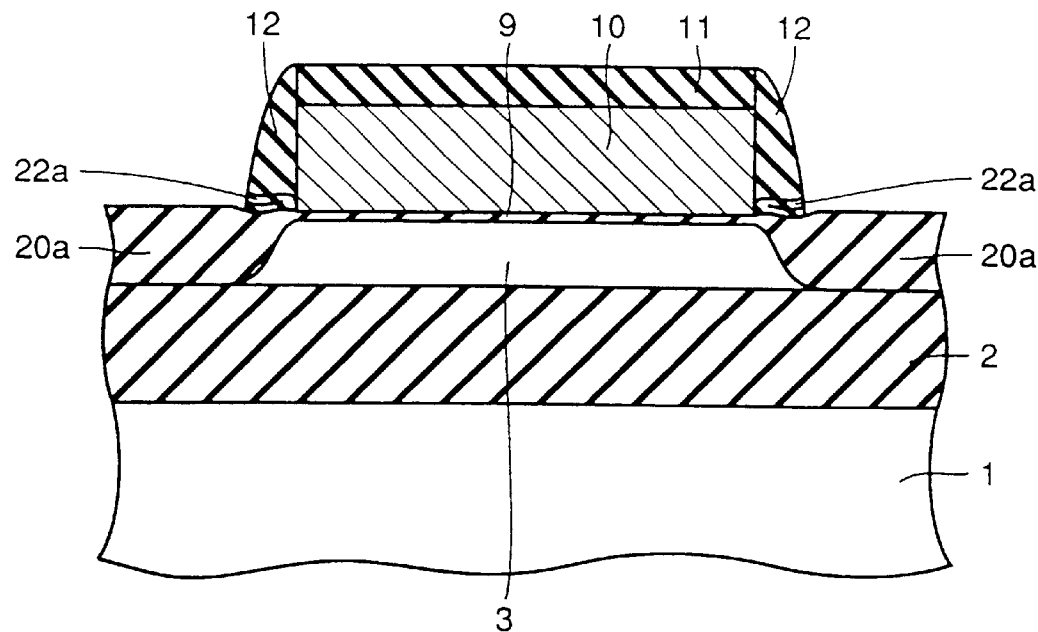

Then, the above-described nitride layer 22 is subjected to anisotropic etching. As a result, it is possible to leave nitride spacer 22a at the region immediately under nitride spacer 12 only, as shown in FIG. 35. It is because nitride layer 22 is formed after removal of oxide layer 20a' formed to extend to a region under nitride spacer 12 such that nitride layer 22 can be formed to extend to a region immediately under nitride spacer 12.

Thereafter, using nitride layer 11, nitride spacer 12 and nitride spacer 22a as a mask, SOI layer 3 is again subjected to heat treatment under oxide atmosphere. Accordingly, oxide layer 20a is formed selectively at SOI layer 3 to reach buried oxide layer 2. With oxide layer 20a formed as a result of such process including two steps, it is possible to reduce the bird's beak as compared to oxide layer 20 shown in FIG. 27. Thus, the slope of the two sidewalls 3a of SOI layer 3 can be made steeper.

Then, using hot phosphoric acid or the like, nitride layer 11, nitride spacer 12 and nitride spacer 22a are removed. Then, using polycrystalline silicon layer 10 as a mask, ion implantation of boron is performed to the region in the vicinity of the edge portion of SOI layer 3 from a substantially vertical direction. Thus, channel stopper region 4 containing a p type impurity of high concentration is formed in a self-aligned manner.

Figure 38:
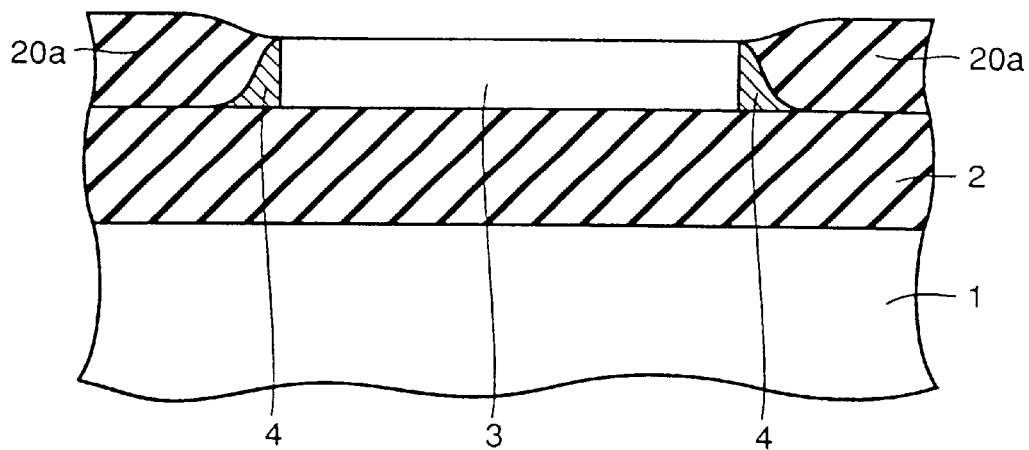

Thereafter, polycrystalline silicon layer 10 and oxide layer 9 are removed. Thus, as shown in FIG. 38, the surface of SOI layer 3 is selectively exposed. Then, a gate insulation layer 7 is formed on the surface of this exposed SOI layer 3, and a gate electrode 8 is formed on this gate insulation layer 7. By carrying out the process described above, the semiconductor device shown in FIG. 32 is formed.

Figure 39:
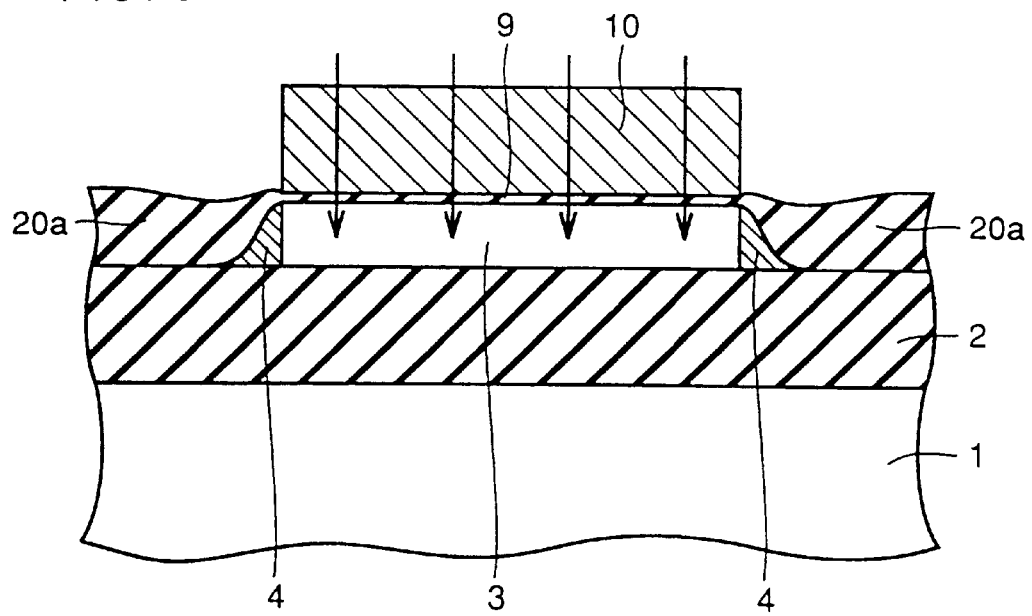
FIG. 39 is a cross-sectional view showing how channel doping is performed in Embodiment 6.

As shown in FIG. 39, channel doping can be performed with polycrystalline silicon layer 10 employed for formation of channel stopper region 4 still formed, in this embodiment also. This concept is also applicable to the above-described Embodiment 5.

Figure 40:
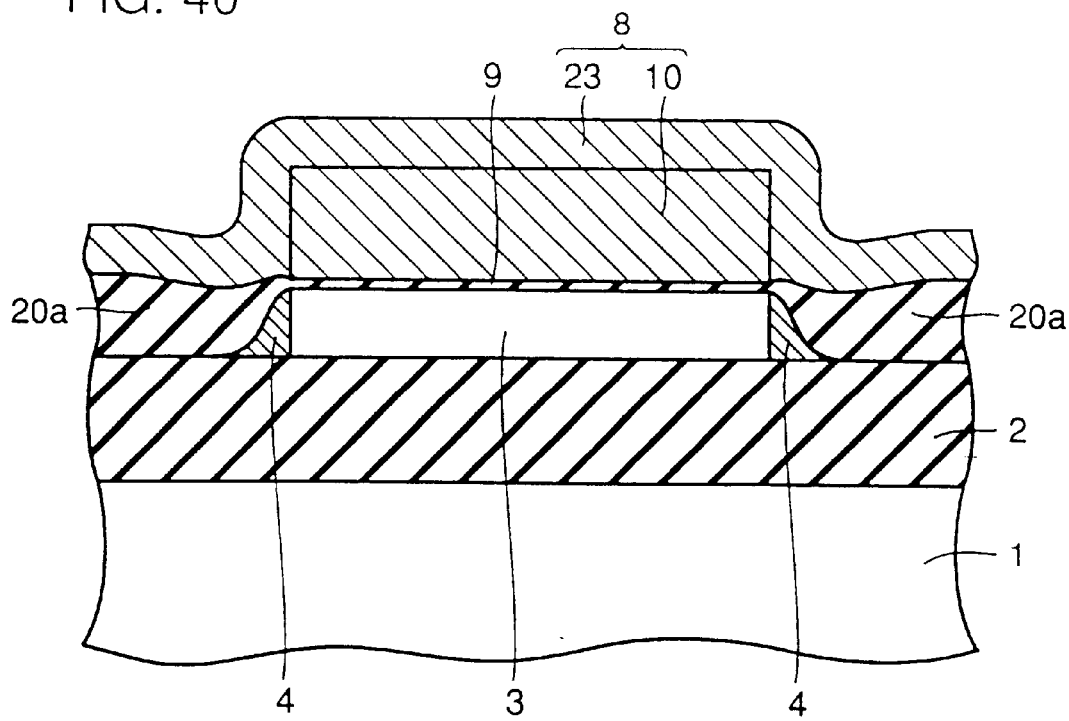
FIG. 40 is a cross-sectional view showing a semiconductor device according to a modification of Embodiment 6.

Referring next to FIG. 40, modification of Embodiment 6 will be described. FIG. 40 is a cross-sectional view showing a semiconductor device according to the modification of Embodiment 6.

Figure 37:
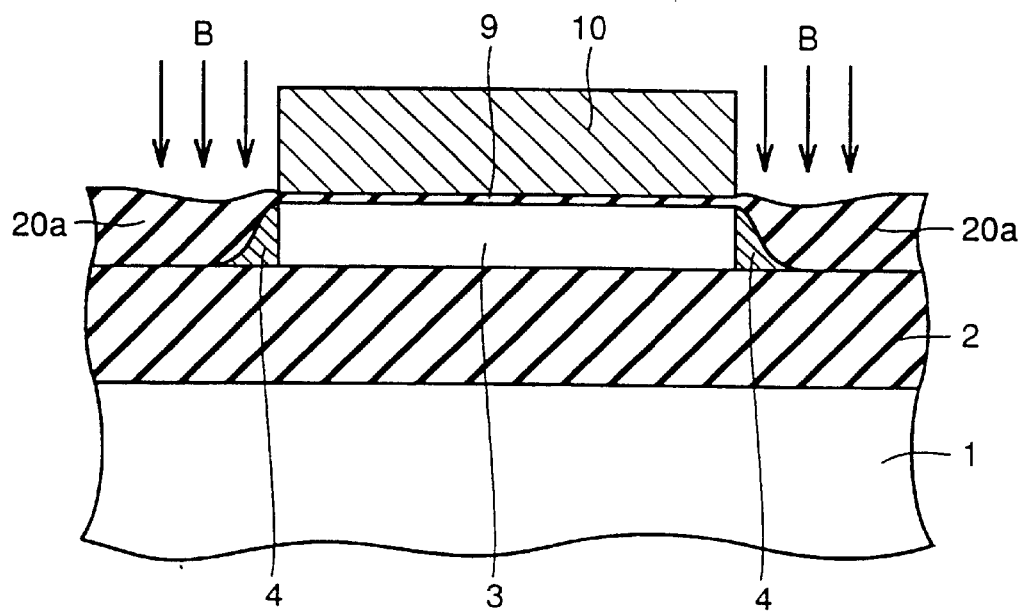

Referring to FIG. 40, polycrystalline silicon layer 10 shown in FIG. 37 is not removed, and polycrystalline silicon layer 23 is additionally formed on this polycrystalline silicon layer 10. By patterning polycrystalline silicon layer 23 and polycrystalline silicon layer 10 simultaneously, gate electrode 8 is formed. Thus, the step of removing polycrystalline silicon layer 10 and oxide layer 9 can be omitted such that manufacturing process can be simplified as compared to the process of the above-described Embodiment 6.

[Embodiment 7]

Figure 41:
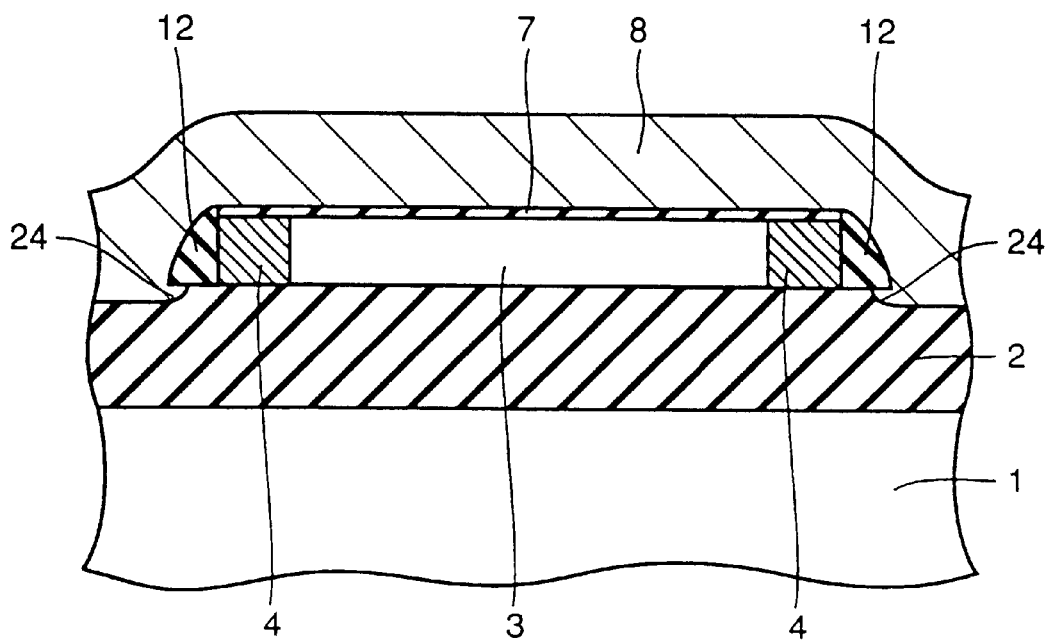
FIG. 41 is cross-sectional view showing a semiconductor device according to Embodiment 7.

Referring next to FIGS. 41 to 46, Embodiment 7 according to the present invention and a modification thereof will now be described. FIG. 41 is a cross-sectional view showing the semiconductor device according to Embodiment 7 of the present invention.

Referring to FIG. 41, a nitride spacer 12 is formed on both sidewalls of SOI layer 3 in this Embodiment 7. In addition, gate electrode 8 is extended from a region over SOI layer 3 to over nitride spacer 12. By providing such nitride spacer 12, gate electrode 8 can be kept away from the side bottom portion of SOI layer 3. Also, by forming nitride spacer 12, recess portion 24 would be terminated under nitride spacer 12 and would not be extended to reach the region immediately under SOI layer 3. Based upon the foregoing, it is possible to effectively suppress the insulation breakdown of the gate insulation layer in the vicinity of the edge portion of SOI layer 3 which has been the problem of the conventional example.

Referring next to FIGS. 42 to 45, a method of manufacturing the semiconductor device shown in FIG. 41 will be described. FIGS. 42 to 45 are cross-sectional views showing first to fourth steps in the manufacturing process of the semiconductor device according to Embodiment 7 in FIG. 41.

Figure 42:
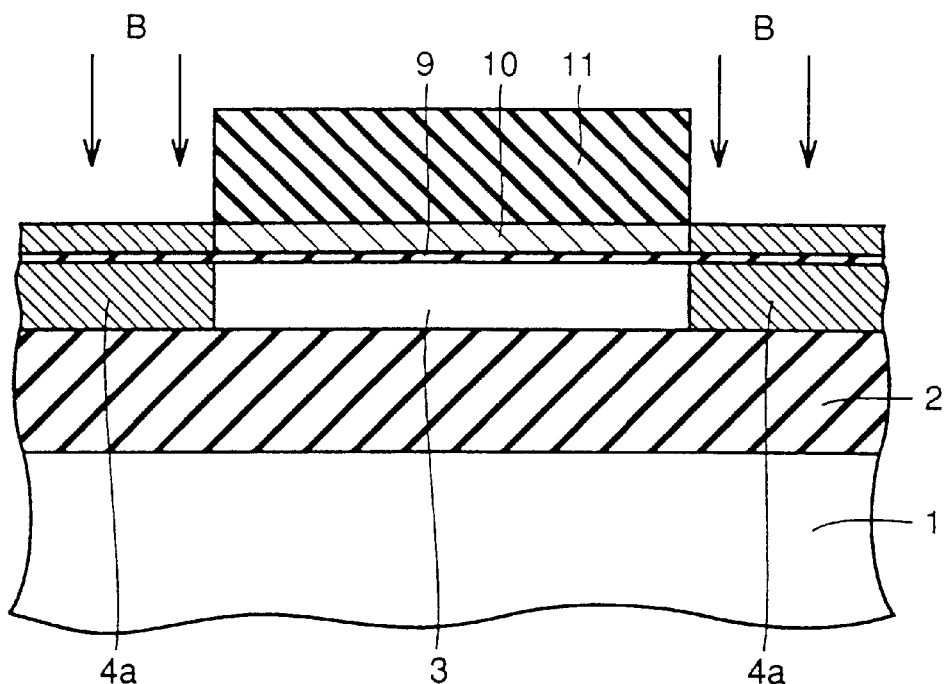
FIGS. 42 to 45 are cross-sectional views showing the first to fourth steps in the manufacturing process of the semiconductor device according to Embodiment 7.

Referring to FIG. 42, a process similar to that of Embodiment 1 described above is carried on until nitride layer 11 is formed. In this Embodiment 7, it is preferred that thickness of oxide layer 9 is about 10 to about 30 nm, the thickness of polycrystalline silicon layer 10 is about 50 to about 100 nm, and the thickness of nitride layer 11 is about 200 to about 250 nm. Then, a photoresist (not shown) patterned to obtain a shape of an element formation region is formed on nitride layer 11. This photoresist is used as a mask to pattern nitride layer 11. Using this nitride layer 11 as a mask, ion implantation of boron is performed to SOI layer 3. Accordingly, an impurity implantation region 4a is formed selectively in SOI layer 3.

Figure 43:
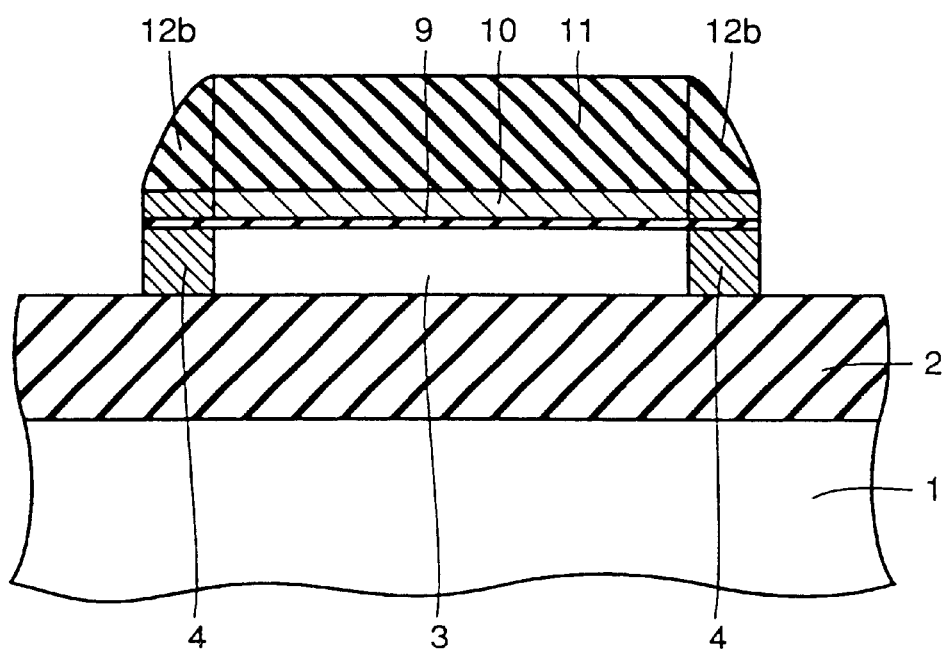

Then, a nitride layer is deposited entirely on the surface, and is subjected to anisotropic etching. Thus, a nitride spacer 12b is formed on the sidewall of nitride layer 11. Using this nitride spacer 12b and nitride layer 11 as a mask, polycrystalline silicon layer 10, oxide layer 9 and SOI layer 3 are patterned successively. Accordingly, a channel stopper region 4 is formed in the vicinity of the edge portion of SOI layer 3, as shown in FIG. 43. The nitride layer for forming nitride spacer 12b would be acceptable if it has a thickness in the range of about 30 to about 100 nm.

Figure 44:
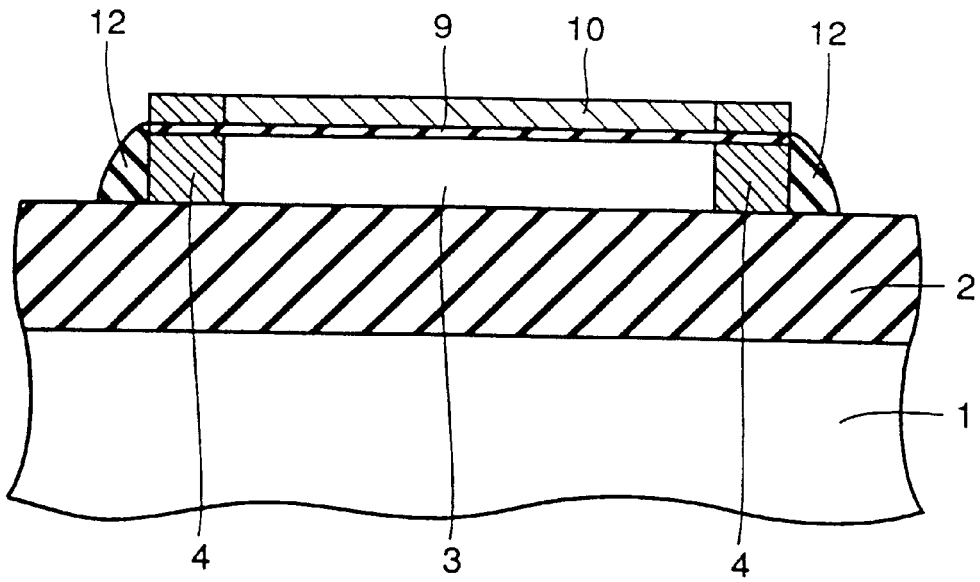

Then, nitride layer 11 and nitride spacer 12b are removed by hot phosphoric acid or the like. Thereafter, an insulation layer (not shown) such as oxide or nitride is deposited entirely on the surface, and this insulation layer is subjected to anisotropic etching. As a result, a nitride spacer 12, for example, is formed on the sidewall of SOI layer 3 as shown in FIG. 44. Here, since polycrystalline silicon layer 10 is formed on SOI layer 3, such that no etching damage is caused at the surface of SOI layer 3 by the anisotropic etching for formation of nitride spacer 12.

Polycrystalline silicon layer 10 is then removed by, for example, isotropic etching followed by wet etching for removing oxide layer 9. Thus, the surface of SOI layer 3 is exposed. At this time, the surface of buried oxide layer 2 is also subjected to etching to a certain extent, forming a recess portion 24 having a depth D. However, since this recess portion 24 ends at the region under nitride spacer 12, the side bottom portion of SOI layer 3 will not be exposed. Accordingly, it is possible to suppress the insulation breakdown of gate insulation layer at the edge portion of SOI layer 3.

Thereafter, gate insulation layer 7 is formed on the surface of SOI layer 3, and a gate electrode 8 is formed on this gate insulation layer 7. By the process described above, the semiconductor device shown in FIG. 41 is formed.

Figure 45:
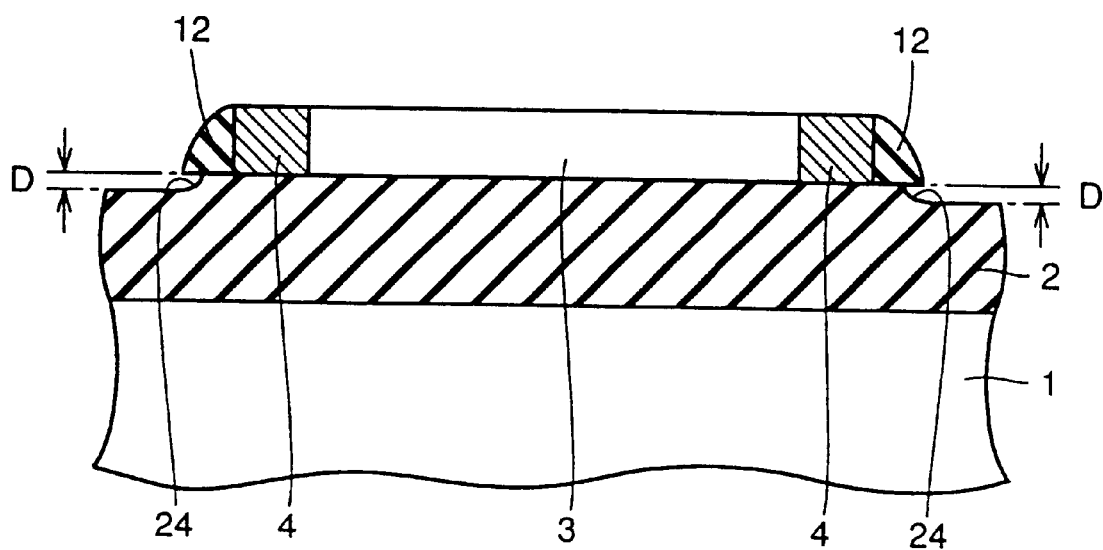

With recess portion 24 formed as shown in FIG. 45, there may be the problem that the substance for forming the gate electrode 8 would remain in this recess portion 24 upon patterning of gate electrode B. Accordingly, it may be preferable that an additional process of isotropic etching is performed upon formation of gate electrode 8.

Figure 46:
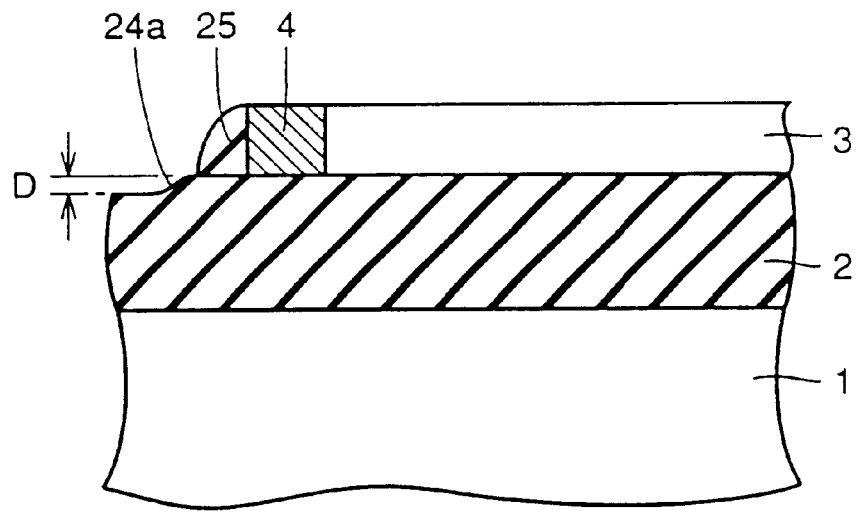
FIG. 46 is a cross-sectional view showing a modification of the manufacturing process of FIG. 45.
Figure 47:
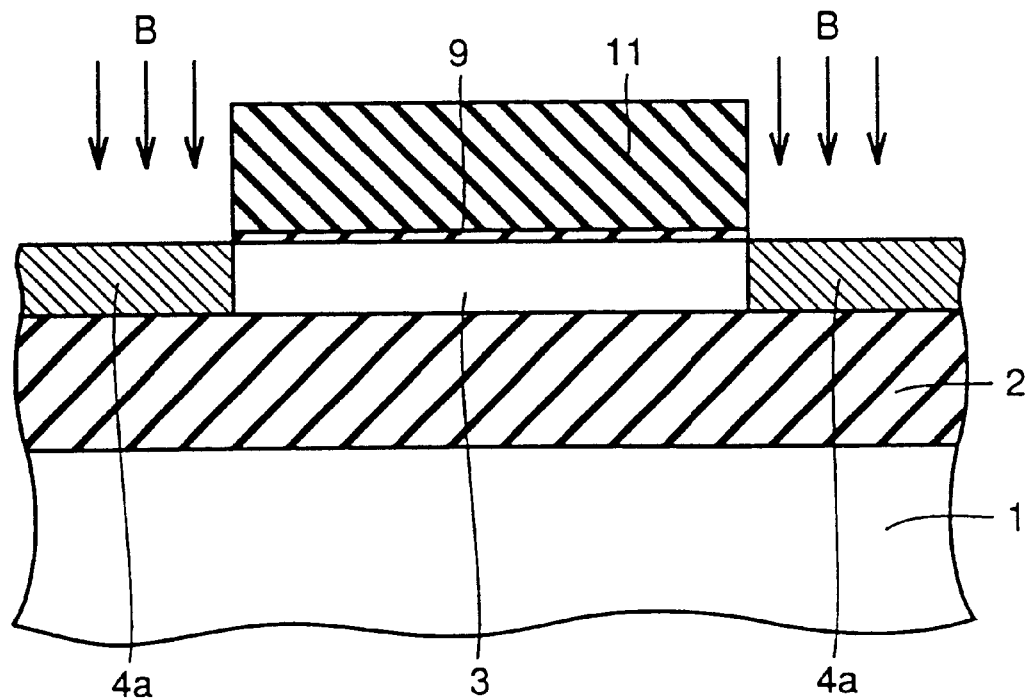
FIGS. 47 and 48 are cross-sectional views showing the first and second steps in the manufacturing process of a conventional semiconductor device using LOCOS method.
Figure 48:
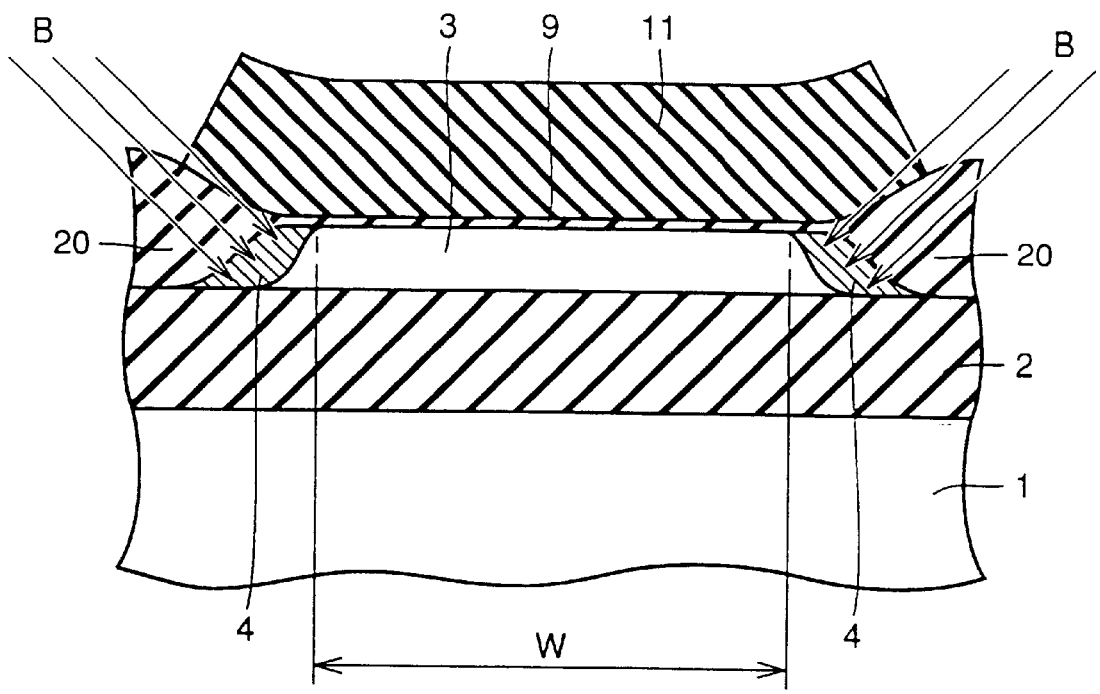
Figure 49:
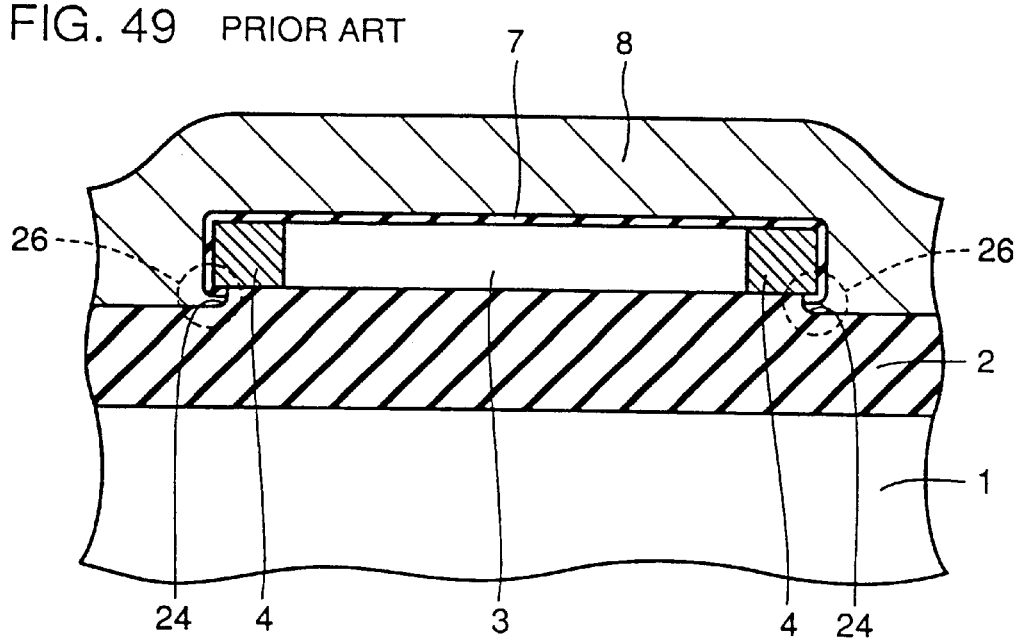
FIG. 49 is a cross-sectional view showing a semiconductor device using a conventional mesa isolation method.
Figure 50:
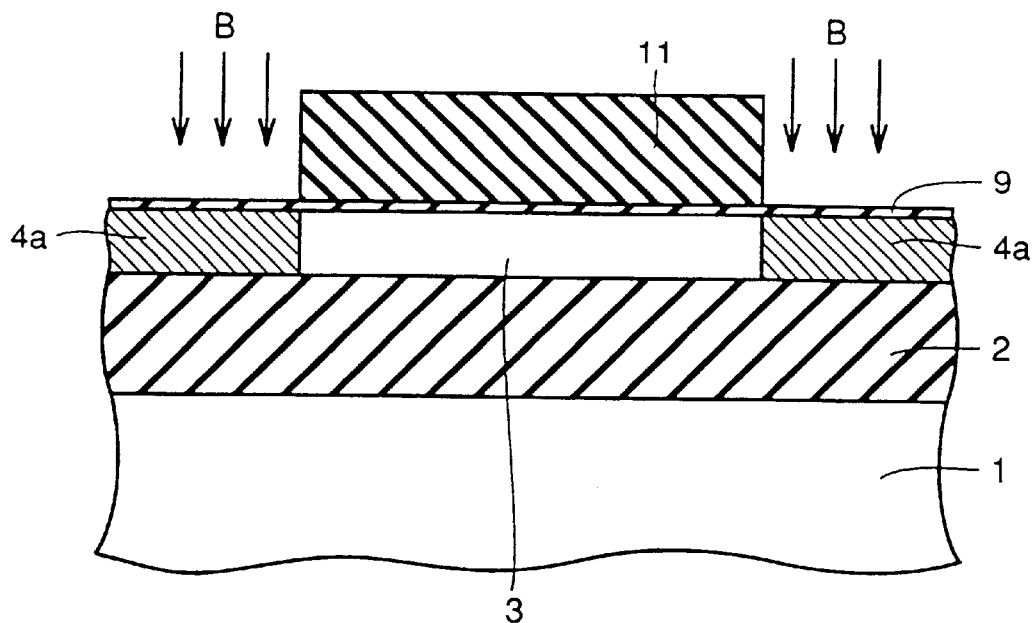
FIGS. 50 and 51 are cross-sectional views showing the first and second steps in the manufacturing process of the semiconductor device shown in FIG. 49.
Figure 51:
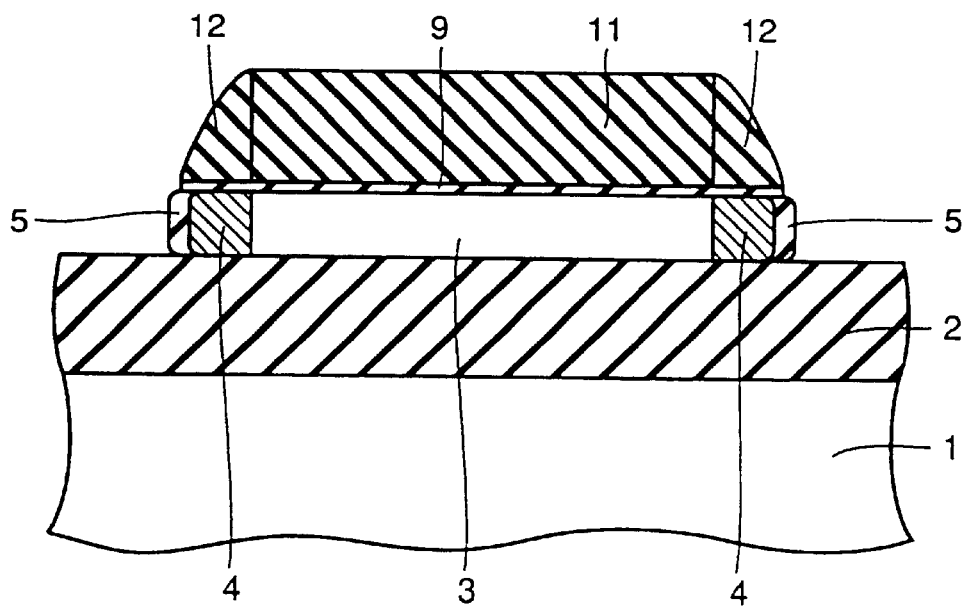

Referring next to FIG. 46, a modification of Embodiment 7 would be described. FIG. 46 is a partial cross-sectional view showing a manufacturing process characteristic in this modification.

In the above Embodiment 7, nitride spacer 12 was formed on the sidewall of SOI layer 3. Meanwhile, in this modification, a CVD oxide spacer 25 is formed on the sidewall of SOI layer 3. More preferably, this CVD oxide spacer 25 is formed of CVD oxide employing TEOS. It is generally known that CVD oxide has an etching rate greater than thermal oxide. Even when a recess portion 24a having a depth D is formed at buried oxide layer 2 upon etching of polycrystalline silicon layer 10 or oxide layer 9, this recess portion 24a is prevented effectively from being formed to extend under CVD oxide spacer 25, because buried oxide layer 2 has a nature similar to that of thermal oxide. Thus, patterning of gate electrode 8 can be performed easier as compared to the case of Embodiment 7 described above.

Oxide layer 9 described above may also be formed by CVD oxide. In this way, depth D of recess portions 24, 24a can be made small.

In each of the embodiment described above, a representative example of the nitride layer may be of silicon nitride, while a representative example of the oxide layer may be of silicon oxide. When polycrystalline silicon layer is used as gate electrode 8, it is preferred that p or n type impurity is appropriately doped into the polycrystalline silicon layer. Also, when dual gate is formed, photoresist may be used for nMOS transistor and pMOS transistor so that the gate electrode formed of polycrystalline silicon is doped with n type dopant or p type dopant.

As has been described above, in accordance with the semiconductor device of the present invention, it is possible to keep away the gate electrode from the edge portion of the semiconductor layer by an isolating insulation layer. Accordingly, reduction of the threshold voltage Vth of a parasitic MOS transistor can be suppressed effectively at the edge portion of the semiconductor layer. In addition, since the isolating insulation layer has a function to protect the edge portion of the semiconductor layer also, insulation breakdown of the gate electrode at the edge portion of the semiconductor layer can be suppressed effectively as in the conventional example.

According to the method of manufacturing the semiconductor device of the present invention, the channel stopper region can be formed after performing oxidation of the portion adjacent to the region where channel stopper region is formed. Accordingly, it is possible to effectively suppress draw of the impurity from the channel stopper region. As a result, reduction of impurity concentration within channel stopper region can be suppressed effectively, and reduction of the threshold voltage Vth of the parasitic MOS transistor at the edge portion of the semiconductor layer can be suppressed effectively. Accordingly, a highly reliable semiconductor device can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the steps of:

preparing an SOI substrate in which a semiconductor layer is formed on main surface of a semiconductor substrate with a buried insulation layer therebetween;

forming an insulation layer on said semiconductor layer and forming a first masking layer selectively on said insulation layer;

forming a second masking layer of a material different from that of said first masking layer selectively on said insulation layer to cover a sidewall and an upper surface of said first masking layer;

patterning said insulation layer and said semiconductor layer, using said second masking layer as a mask;

after removing said second masking layer, forming a sidewall insulation layer on a surface of said sidewall of said first masking layer and a surface of the sidewall of said semiconductor layer;

exposing selectively a surface of said semiconductor layer by removing said first masking layer and said insulation layer;

forming a gate electrode on the surface exposed of said semiconductor layer with a gate insulation layer therebetween; and forming source/drain regions in a surface of said semiconductor layer.

2. The method of claim 1, wherein said first masking layer is formed of polycrystalline silicon and said second masking layer is formed of nitride.

3. A method of manufacturing a semiconductor device, comprising the steps of:

preparing an SOI substrate in which a semiconductor layer is formed on a main surface of a semiconductor substrate with a buried insulation layer therebetween;

forming an insulation layer on said semiconductor layer and forming a first masking layer selectively on said insulation layer;

forming a second masking layer of a material different from that of said first masking layer selectively on said insulation layer to cover a sidewall and an upper surface of said first masking layer;

patterning said insulation layer and said semiconductor layer, using said second masking layer as a mask;

after removing said second masking layer, forming an insulating isolating insulation layer on said buried insulation layer to cover said first masking layer and said semiconductor layer;

removing a portion of said isolating insulation layer to expose the upper surface of said first masking layer;

forming a gate electrode on the surface exposed of said semiconductor layer with a gate insulation layer therebetwen; and forming source/drain regions in a surface of said semiconductor layer.

4. The method of claim 3, wherein:

said first masking layer is formed of polycrystalline silicon; and the step of forming said gate electrode further includes the steps of exposing selectively the surface of said semiconductor layer by removing said exposed first masking layer and said insulation layer, and forming said gate electrode on the surface of said exposed semiconductor layer with said gate insulation layer therebetween.

5. The method of claim 3, wherein:

said first masking layer is formed of polycrystalline silicon; and the step of forming said gate electrode further includes the steps of forming a polycrystalline silicon layer on said first masking layer to extend on said isolating insulation layer, and forming said gate electrode by patterning said polycrystalline silicon layer and said first masking layer.

6. The method of claim 3, wherein:

said first masking layer includes first and second polycrystalline silicon layers and an oxide layer interposed between said first and second polycrystalline silicon layers;

the step of forming said first masking layer includes the step of forming said first polycrystalline silicon layer, said oxide layer and said second polycrystalline layer successively on said insulation layer;

the step of removing the portion of said isolating insulation layer to expose the upper surface of said first masking layer, and to expose a surface of said second polycrystalline silicon layer; and the step of forming said gate electrode includes the steps of removing said second polycrystalline silicon layer and said oxide layer, forming a third polycrystalline silicon layer on said first polycrystalline silicon layer to extend on said isolating insulation layer, and forming said gate electrode by patterning said third and first polycrystalline silicon layers.

7. The method of claim 6, wherein:

the steps of forming said first masking layer includes the steps of forming a nitride layer on said second polycrystalline silicon layer and forming first and second sidewall oxide layers by oxidizing the sidewalls of said first and second polycrystalline silicon layers using said nitride layer as a mask; and the step of forming said second masking layer includes the steps of forming said second masking layer to cover said first and second sidewall oxide layers.

* * * * *